United States Patent
Chen et al.

(10) Patent No.: US 12,112,808 B2
(45) Date of Patent: Oct. 8, 2024

(54) READ VOLTAGE CALIBRATION METHOD, MEMORY STORAGE DEVICE, AND MEMORY CONTROL CIRCUIT UNIT

(71) Applicant: PHISON ELECTRONICS CORP., Miaoli (TW)

(72) Inventors: Szu-Wei Chen, New Taipei (TW); An-Cin Li, Taipei (TW); Yu-Hung Lin, Miaoli County (TW); Kai-Wei Tsou, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 101 days.

(21) Appl. No.: 18/179,372

(22) Filed: Mar. 7, 2023

(65) Prior Publication Data
US 2024/0249778 A1   Jul. 25, 2024

(30) Foreign Application Priority Data

Jan. 19, 2023   (TW) .................. 112102744

(51) Int. Cl.
| | |
|---|---|
| G06F 11/10 | (2006.01) |
| G06F 3/06 | (2006.01) |
| G06F 11/07 | (2006.01) |
| G06F 11/30 | (2006.01) |
| G06F 13/16 | (2006.01) |
| G06F 13/28 | (2006.01) |
| G11C 16/04 | (2006.01) |
| G11C 16/26 | (2006.01) |

(52) U.S. Cl.
CPC ............ *G11C 16/26* (2013.01); *G06F 3/0619* (2013.01); *G06F 3/0659* (2013.01); *G06F 3/0688* (2013.01); *G06F 11/1068* (2013.01); *G11C 16/0483* (2013.01)

(58) Field of Classification Search
CPC . G11C 16/26; G11C 16/0483; G06F 11/1068; G06F 3/0619; G06F 3/0659; G06F 3/0688
See application file for complete search history.

(56) References Cited

U.S. PATENT DOCUMENTS

| 11,955,184 B2* | 4/2024 | Guo ................... G11C 16/3459 |
| 2020/0142771 A1* | 5/2020 | Cho ........................ G11C 29/52 |
| 2022/0291845 A1* | 9/2022 | Kasai ................. G11C 16/3404 |

FOREIGN PATENT DOCUMENTS

CN   112889112 B   *   5/2022   .......... G06F 11/1048

* cited by examiner

*Primary Examiner* — Guy J Lamarre
(74) *Attorney, Agent, or Firm* — JCIPRNET

(57) ABSTRACT

A read voltage calibration method, a memory storage device, and a memory control circuit unit are provided. The read voltage calibration method includes: reading data from a first physical unit by using multiple read voltage levels; decoding the data to obtain multiple error evaluation parameters; determining a first vector distance parameter according to a first error evaluation parameter; determining multiple candidate read voltage levels according to the first vector distance parameter and a first read voltage level; determining a target read voltage level according to one of the candidate read voltage levels; and reading the data again from the first physical unit by using the target read voltage level.

24 Claims, 14 Drawing Sheets

$$\begin{bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{bmatrix} \begin{Bmatrix} V_0 \\ V_1 \\ V_2 \\ V_3 \\ V_4 \\ V_5 \\ V_6 \\ V_7 \\ V_8 \end{Bmatrix} = \begin{Bmatrix} S_0 \\ S_1 \\ S_2 \\ S_3 \\ S_4 \\ S_5 \\ S_6 \\ S_7 \end{Bmatrix}$$

FIG. 9

READ VOLTAGE CALIBRATION METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 112102744, filed on Jan. 19, 2023. The entirety of the above-mentioned patent application is hereby incorporated by reference herein and made a part of this specification.

BACKGROUND

Technical Field

The disclosure relates to a memory control technology, and in particular to a read voltage calibration method, a memory storage device, and a memory control circuit unit.

Description of Related Art

Portable electronic devices such as mobile phones and notebook computers have grown rapidly in the past few years, which has led to a rapid increase in consumer demand for storage media. As the rewritable non-volatile memory module (for example, a flash memory) has characteristics such as non-volatile data, power saving, small volume, and no mechanical structure, the rewritable non-volatile memory module is very suitable for being built into various portable electronic devices exemplified above.

In a memory storage device in which a memory cell may store multiple bits, multiple preset read voltage levels may be used to read data stored in the memory cell. However, after the memory storage device is used for a period of time, as the memory cell wears out, the preset read voltage levels may seriously shift relative to the threshold voltage distribution of the memory cell. Reading the data by using the shifted read voltage levels may increase the bit error rate of the data, and may even shorten the service life of the memory storage device.

SUMMARY

The disclosure provides a read voltage calibration method, a memory storage device, and a memory control circuit unit, which can improve the calibration efficiency of a read voltage level.

An exemplary embodiment of the disclosure provides a read voltage calibration method, which is used for a rewritable non-volatile memory module. The rewritable non-volatile memory module includes multiple physical units. The read voltage calibration method includes the following steps. Data is read from a first physical unit among the physical units by using multiple read voltage levels. The data is decoded to obtain multiple error evaluation parameters. The error evaluation parameters respectively correspond to one of the read voltage levels. A first vector distance parameter is determined according to a first error evaluation parameter among the error evaluation parameters. The first error evaluation parameter corresponds to a first read voltage level among the read voltage levels. Multiple candidate read voltage levels are determined according to the first vector distance parameter and the first read voltage level. A target read voltage level is determined according to one of the candidate read voltage levels. The data is read again from the first physical unit by using the target read voltage level.

An exemplary embodiment of the disclosure also provides a memory storage device, which includes a connection interface unit, a rewritable non-volatile memory module, and a memory control circuit unit. The connection interface unit is configured to couple to a host system. The rewritable non-volatile memory module includes multiple physical units. The memory control circuit unit is coupled to the connection interface unit and the rewritable non-volatile memory module. The memory control circuit unit is configured to execute the following. Multiple first read command sequences are sent. The first read command sequences are configured to instruct to read data from a first physical unit among the physical units by using multiple read voltage levels. The data is decoded to obtain multiple error evaluation parameters. The error evaluation parameters respectively correspond to one of the read voltage levels. A first vector distance parameter is determined according to a first error evaluation parameter among the error evaluation parameters. The first error evaluation parameter corresponds to a first read voltage level among the read voltage levels. Multiple candidate read voltage levels are determined according to the first vector distance parameter and the first read voltage level. A target read voltage level is determined according to one of the candidate read voltage levels. A second read command sequence is sent. The second read command sequence is configured to instruct to read the data again from the first physical unit by using the target read voltage level.

An exemplary embodiment of the disclosure also provides a memory control circuit unit, which is used for controlling a rewritable non-volatile memory module. The memory control circuit unit includes a host interface, a memory interface, an error detection and calibration circuit, and a memory management circuit. The host interface is configured to couple to a host system. The memory interface is configured to couple to the rewritable non-volatile memory module. The rewritable non-volatile memory module includes multiple physical units. The memory management circuit is coupled to the host interface, the memory interface, and the error detection and calibration circuit. The memory management circuit is configured to execute the following. Multiple first read command sequences are sent. The first read command sequences are configured to instruct to read data from a first physical unit among the physical units by using multiple read voltage levels. The error detection and calibration circuit is instructed to decode the data to obtain multiple error evaluation parameters. The error evaluation parameters respectively correspond to one of the read voltage levels. A first vector distance parameter is determined according to a first error evaluation parameter among the error evaluation parameters. The first error evaluation parameter corresponds to a first read voltage level among the read voltage levels. Multiple candidate read voltage levels are determined according to the first vector distance parameter and the first read voltage level. A target read voltage level is determined according to one of the candidate read voltage levels. A second read command sequence is sent. The second read command sequence is configured to instruct to read the data again from the first physical unit by using the target read voltage level.

Based on the above, after reading the data from the first physical unit by using the read voltage levels, the data may be decoded to obtain the error evaluation parameters corresponding to the read voltage levels. According to the first error evaluation parameter among the error evaluation parameters, the first vector distance parameter corresponding to the first read voltage level may be determined. According to the first vector distance parameter and the first read voltage level, the candidate read voltage levels may be determined. Thereafter, the target read voltage level may be determined according to one of the candidate read voltage levels. Thereby, the calibration efficiency of the read voltage level can be effectively improved.

BRIEF DESCRIPTION OF THE DRAWINGS

FIG. 9 is a schematic diagram of a parity check operation according to an exemplary embodiment of the disclosure.

DETAILED DESCRIPTION OF DISCLOSED EMBODIMENTS

Generally speaking, a memory storage device (also referred to as a memory storage system) includes a rewritable non-volatile memory module and a controller (also referred to as a control circuit). The memory storage device may be used together with a host system, so that the host system may write data to the memory storage device or read data from the memory storage device.

Figure 1:
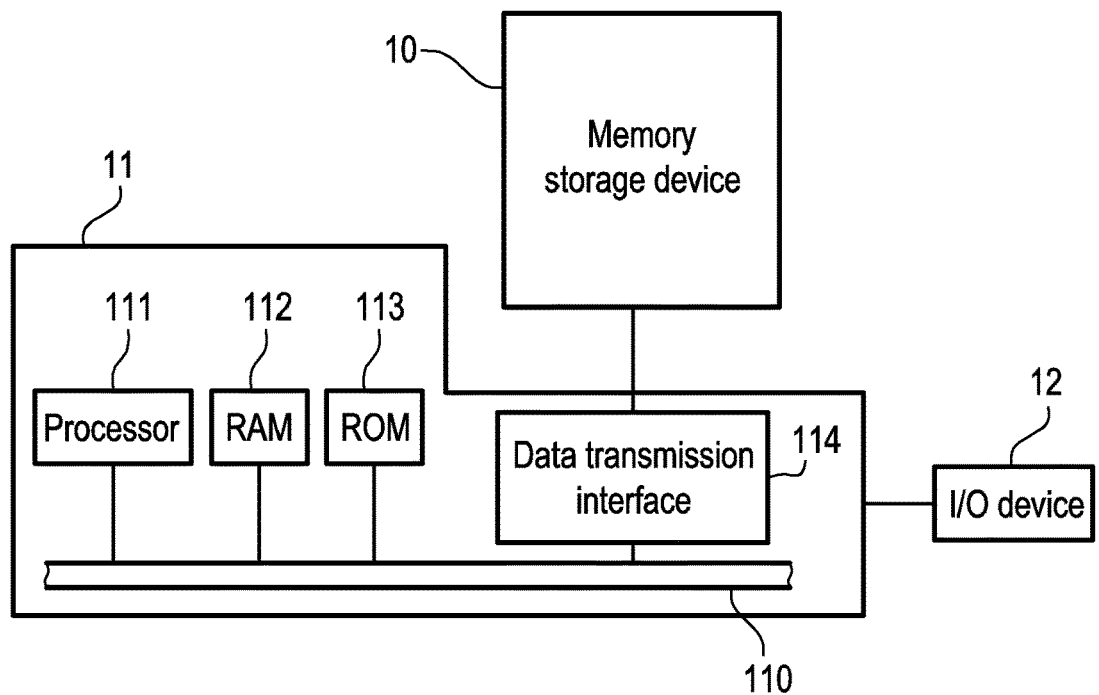
FIG. 1 is a schematic diagram of a host system, a memory storage device, and an input/output (I/O) device according to an exemplary embodiment of the disclosure.
Figure 2:
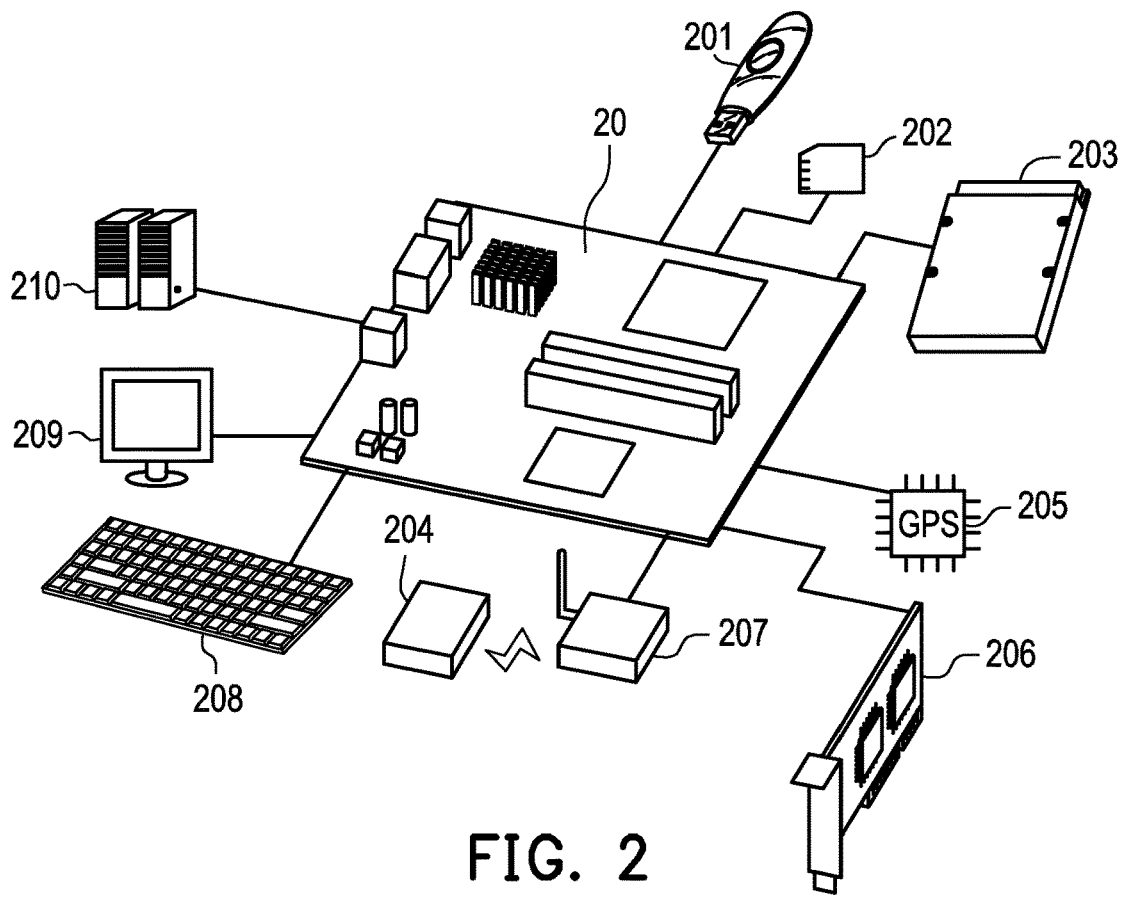
FIG. 2 is a schematic diagram of a host system, a memory storage device, and an I/O device according to another exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Please refer to FIG. 1 and FIG. 2. A host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to the memory storage device 10 through the data transmission interface 114. For example, the host system 11 may store data in the memory storage device 10 or read data from the memory storage device 10 via the data transmission interface 114. In addition, the host system 11 may be coupled to the I/O device 12 through the system bus 110. For example, the host system 11 may send an output signal to the I/O device 12 or receive an input signal from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via a wired or wireless manner.

In an exemplary embodiment, the memory storage device 10 may be, for example, a flash drive 201, a memory card 202, a solid state drive (SSD) 203, or a wireless memory storage device 204. The wireless memory storage device 204 may be, for example, a near field communication (NFC) memory storage device, a WiFi memory storage device, a Bluetooth memory storage device, a low-power Bluetooth memory storage device (for example, iBeacon), or other memory storage devices based on various wireless communication technologies. In addition, the motherboard 20 may also be coupled to a global positioning system (GPS) module 205, a network interface card 206, a wireless transmission device 207, a keyboard 208, a screen 209, a speaker 210, or various other I/O devices through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include a memory storage device 30 and a host system 31 of FIG. 3.

Figure 3:
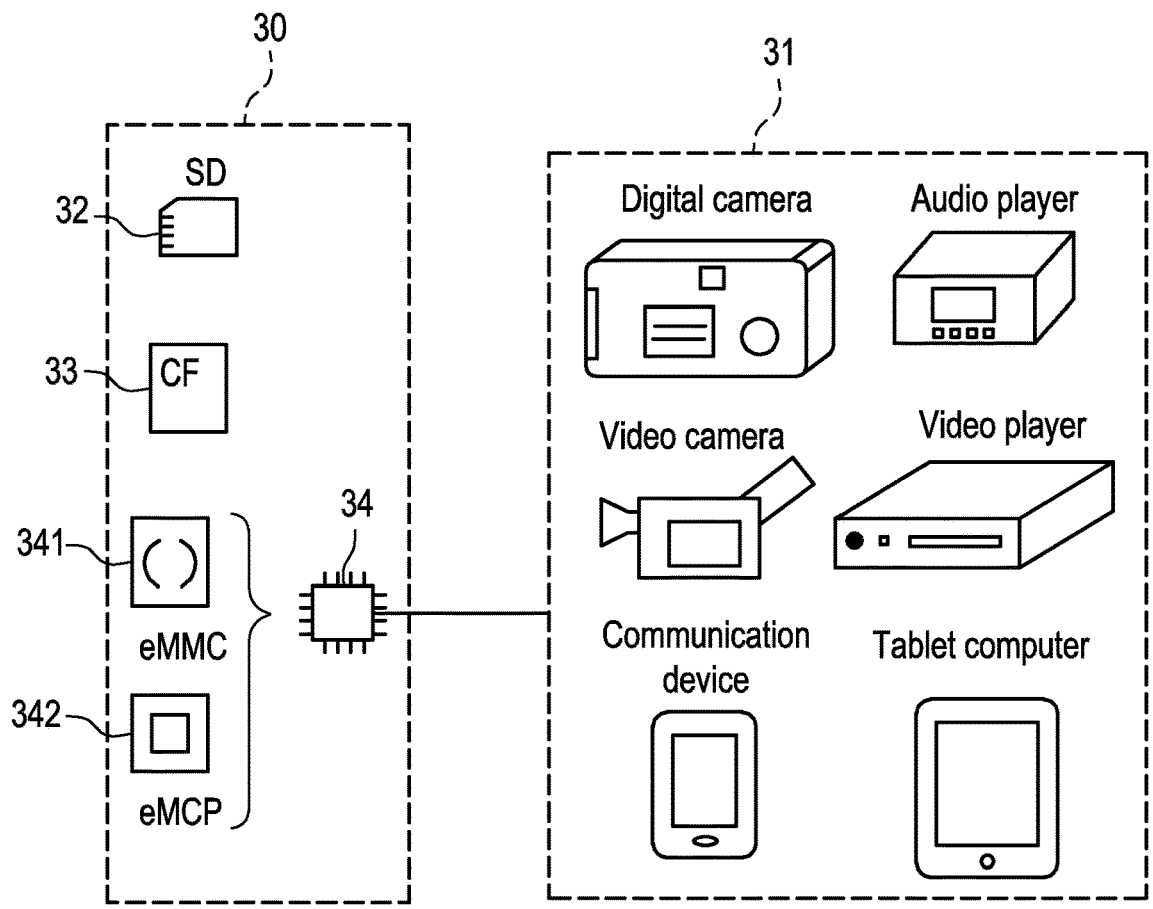
FIG. 3 is a schematic diagram of a host system and a memory storage device according to another exemplary embodiment of the disclosure.

FIG. 3 is a schematic diagram of a host system and a memory storage device according to an exemplary embodiment of the disclosure.

Please refer to FIG. 3. The memory storage device 30 may be used in conjunction with the host system 31 to store data. For example, the host system 31 may be a digital camera, a video camera, a communication device, an audio player, a video player, a tablet computer, or other systems. For example, the memory storage device 30 may be a secure digital (SD) card 32, a compact flash (CF) card 33, an embedded storage device 34, or various other non-volatile memory storage devices used by the host system 31. The embedded storage device 34 includes an embedded multi media card (eMMC) 341, an embedded multi chip package (eMCP) storage device 342, and/or various other embedded storage devices in which a memory module is directly coupled onto a substrate of a host system.

Figure 4:
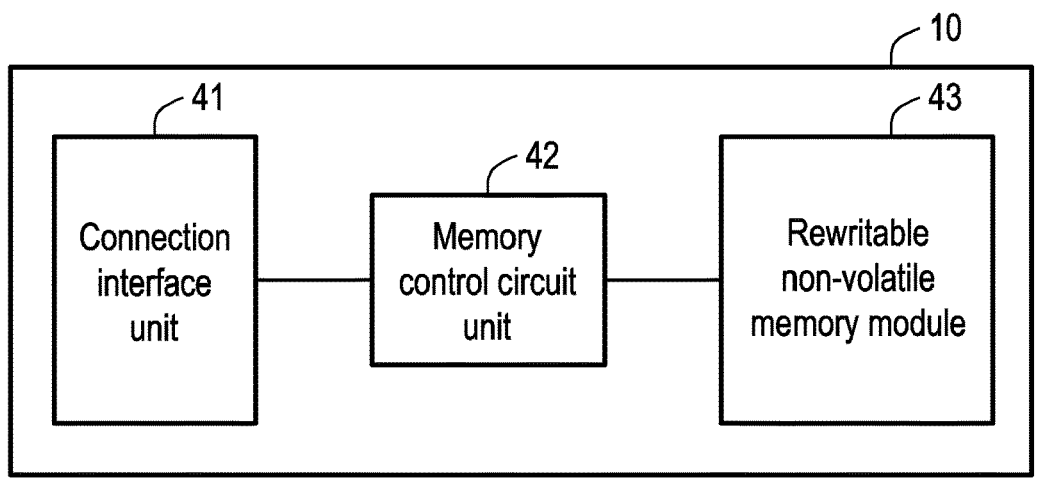
FIG. 4 is a schematic block diagram of a memory storage device according to an exemplary embodiment of the disclosure.

FIG. 4 is a schematic diagram of a memory storage device according to an exemplary embodiment of the disclosure.

Please refer to FIG. 4. The memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may communicate with the host system 11 via the connection interface unit 41. In an exemplary embodiment, the connection interface unit 41 is compatible with the peripheral component interconnect express (PCI express) standard. In an exemplary embodiment, the connection interface unit 41 may also conform to the serial advanced technology attachment (SATA) standard, the parallel advanced technology attachment (PATA) standard, the Institute of Electrical and Electronic Engineers (IEEE) 1394 standard, the universal serial bus (USB) standard, the SD interface standard, the ultra high speed-I (UHS-I) interface standard, the ultra high speed-II (UHS-II) interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 and the memory control circuit unit 42 may be packaged in one chip, or the connection interface unit 41 may be arranged outside a chip including the memory control circuit unit 42.

The memory control circuit unit 42 is coupled to the connection interface unit 41 and the rewritable non-volatile memory module 43. The memory control circuit unit 42 is configured to execute multiple logic gates or control commands implemented in the form of hardware or the form of firmware and perform operations such as data writing, reading, and erasing in the rewritable non-volatile memory module 43 according to a command of the host system 11.

The rewritable non-volatile memory module 43 is configured to store data written by the host system 11. The rewritable non-volatile memory module 43 may include a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 43 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. The operation of changing the threshold voltage of the memory cell is also referred to as "writing data to the memory cell" or "programming the memory cell". As the threshold voltage changes, each memory cell in the rewritable non-volatile memory module 43 has multiple storage states. Through applying a read voltage, it is possible to judge which storage state a memory cell belongs to, so as to obtain one or more bits stored in the memory cell.

In an exemplary embodiment, the memory cells of the rewritable non-volatile memory module 43 may constitute multiple physical programming units, and the physical programming units may constitute multiple physical erasing units. Specifically, the memory cells on the same word line may form one or more physical programming units. If one memory cell may store more than 2 bits, the physical programming units on the same word line may be at least classified into a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area includes multiple physical sectors for storing user data, and the redundancy bit area is configured to store system data (for example, management data such as an error correcting code). In an exemplary embodiment, the data bit area includes 32 physical sectors, and the size of one physical sector is 512 bytes (B). However, in other exemplary embodiments, the data bit area may also include 8, 16, more, or less physical sectors, and the size of each physical sector may also be greater or smaller. On the other hand, the physical erasing unit is the smallest unit of erasure. That is, each physical erasing unit includes the smallest number of memory cells to be erased together. For example, the physical erasing unit is a physical block.

Figure 5:
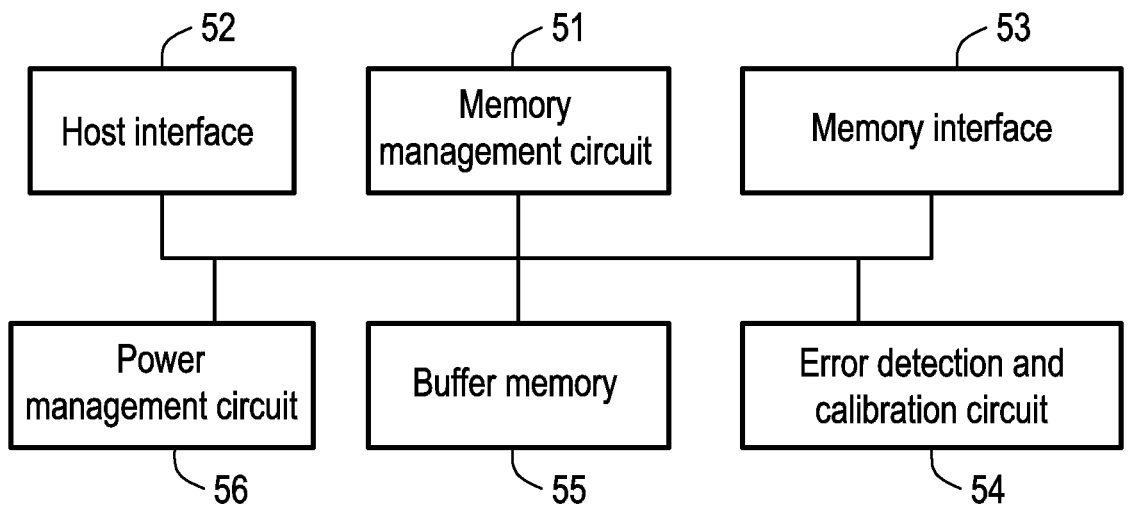
FIG. 5 is a schematic block diagram of a memory control circuit unit according to an exemplary embodiment of the disclosure.

FIG. 5 is a schematic diagram of a memory control circuit unit according to an exemplary embodiment of the disclosure.

Please refer to FIG. 5. The memory control circuit unit 42 includes a memory management circuit 51, a host interface 52, and a memory interface 53. The memory management circuit 51 is configured to control the overall operation of the memory control circuit unit 42. Specifically, the memory management circuit 51 has multiple control commands, and when the memory storage device 10 is operating, the control commands are executed to perform operations such as data writing, reading, and erasing. The following description of the operation of the memory management circuit 51 is equivalent to the description of the operation of the memory control circuit unit 42.

In an exemplary embodiment, the control commands of the memory management circuit 51 are implemented in the form of firmware. For example, the memory management circuit 51 has a microprocessor unit (not shown) and a read only memory (not shown), and the control commands are burnt into the read only memory. When the memory storage device 10 is operating, the control commands are executed by the microprocessor unit to perform operations such as data writing, reading, and erasing.

In an exemplary embodiment, the control commands of the memory management circuit 51 may also be stored in a specific region (for example, a system area dedicated to storing system data in a memory module) of the rewritable non-volatile memory module 43 in the form of program codes. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first executes the boot code to load the control commands stored in the rewritable non-volatile memory module 43 into the random access memory of the memory management circuit 51. After that, the microprocessor unit runs the control commands to perform operations such as data writing, reading, and erasing.

In an exemplary embodiment, the control commands of the memory management circuit 51 may also be implemented in the form of hardware. For example, the memory management circuit 51 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 43. The memory write circuit is configured to issue a write command sequence to the rewritable non-volatile memory module 43 to write data to the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process data to be written to the rewritable non-volatile memory module 43 and data read from the rewritable non-volatile memory module 43. The write command sequence, the read command sequence, and the erase command sequence may individually include one or more program codes or command codes and are configured to instruct the rewritable non-volatile memory module 43 to execute corresponding operations such as writing, reading, and erasing. In an exemplary embodiment, the memory management circuit 51 may also issue other types of command sequences to the rewritable non-volatile memory module 43 to instruct to execute corresponding operations.

The host interface 52 is coupled to the memory management circuit 51. The memory management circuit 51 may communicate with the host system 11 through the host interface 52. The host interface 52 may be configured to receive and identify commands and data sent by the host system 11. For example, the commands and the data sent by the host system 11 may be sent to the memory management circuit 51 through the host interface 52. In addition, the memory management circuit 51 may send the data to the host system 11 through the host interface 52. In the exemplary embodiment, the host interface 52 is compatible with the PCI express standard. However, it must be understood that the disclosure is not limited thereto. The host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is configured to access the rewritable non-volatile memory module 43. For example, the memory management circuit 51 may access the rewritable non-volatile memory module 43 through the memory interface 53. In other words, data to be written to the rewritable non-volatile memory module 43 is converted into a format acceptable by the rewritable non-volatile memory module 43 via the memory interface 53. Specifically, if the memory management circuit 51 intends to access the rewritable non-volatile memory module 43, the memory interface 53 will send the corresponding command sequence. For example, the command sequences may include the write command sequence instructing to write data, the read command sequence instructing to read data, the erase command sequence instructing to erase data, and corresponding command sequences instructing various memory operations (for example, changing a read voltage level, executing a garbage collection operation, etc.). The command sequences are, for example, generated by the memory management circuit 51 and sent to the rewritable non-volatile memory module 43 through the memory interface 53. The command sequences may include one or more signals or data on a bus. The signals or the data may include command codes or program codes. For example, the read command sequence includes information such as a read recognition code and a memory address.

In an exemplary embodiment, the memory control circuit unit 42 further includes an error detection and calibration circuit 54, a buffer memory 55, and a power management circuit 56.

The error detection and calibration circuit 54 is coupled to the memory management circuit 51 and is configured to execute error detection and calibration operations to ensure correctness of data. Specifically, when the memory management circuit 51 receives a write command from the host system 11, the error detection and calibration circuit 54 generates a corresponding error correcting code (ECC) and/or error detecting code (EDC) for data corresponding to the write command, and the memory management circuit 51 writes the data corresponding to the write command and the corresponding error correcting code and/or error detecting code to the rewritable non-volatile memory module 43. Later, when the memory management circuit 51 reads the data from the rewritable non-volatile memory module 43, the error correcting code and/or the error detecting code corresponding to the data are read at the same time, and the error detection and calibration circuit 54 executes the error detection and calibration operations on the read data according to the error correcting code and/or the error detecting code.

The buffer memory 55 is coupled to the memory management circuit 51 and is configured to temporarily store data. The power management circuit 56 is coupled to the memory management circuit 51 and is configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

In an exemplary embodiment, the error detection and calibration circuit 54 supports low-density parity-check (LDPC) codes. For example, the error detection and calibration circuit 54 may utilize the low-density parity-check codes for encoding and decoding. However, in another exemplary embodiment, the error detection and calibration circuit 54 may also support Bose-Chaudhuri-Hocquenghem (BCH) codes, convolutional codes, turbo codes, etc., and the disclosure is not limited thereto.

In the low-density parity-check code, a parity check matrix is used to define a valid codeword. Hereinafter, the parity check matrix is denoted as a matrix H and the codeword is denoted as CW. According to Equation (1) below, if the multiplication of the matrix H and the codeword CW is a zero vector, it means that the codeword CW is a valid codeword. In Equation (1), an operator $\otimes$ represents matrix multiplication modulo 2 (mod 2). In other words, the null space of the matrix H includes all valid codewords. However, the disclosure does not limit the content of the codeword CW. For example, the codeword CW may also include the error correcting code or the error detecting code generated by any algorithm.

$$H \otimes CW^T = 0 \quad (1)$$

In Equation (1), the dimension of the matrix H is k-by-n and the dimension of the codeword CW is 1-by-n, where k and n are positive integers. The codeword CW includes message bits and parity bits. For example, the codeword CW may be expressed as [M P], wherein a vector M is composed of the message bits and a vector P is composed of the parity bits. The dimension of the vector M is 1-by-(n−k) and the dimension of the vector P is 1-by-k. Hereinafter, the message bits and the parity bits are collectively referred to as data bits. In other words, there are n data bits in the codeword CW. In the codeword CW, the length of the message bit is (n−k) bits, the length of the parity bit is k bits, and the code rate of the codeword CW is (n−k)/n.

Generally speaking, a generator matrix (hereinafter denoted as G) is used during encoding, so that Equation (2) below may be satisfied for any vector M. For example, the dimension of the generator matrix G is (n−k)-by-n.

$$M \otimes G = [M\ P] = CW \quad (2)$$

The codeword CW generated by Equation (2) is a valid codeword. Therefore, Equation (2) may be substituted into Equation (1), so as to obtain Equation (3) below.

$$H \otimes G^T \otimes M^T = 0 \quad (3)$$

Since the vector M may be any vector, Equation (4) below must be satisfied. In other words, after determining the matrix H (that is, the parity check matrix), the corresponding generator matrix G may also be determined.

$$H \otimes G^T = 0 \quad (4)$$

When decoding the codeword CW, a parity check operation is first performed on the data bits in the codeword CW, for example, the matrix H is multiplied by the codeword CW to generate a vector (hereinafter denoted as S, as shown in Equation (5) below). A vector S is also referred to as a syndrome vector. If the vector S is a zero vector, the codeword CW may be directly output. If the vector S is not a zero vector, it means that the codeword CW is not a valid codeword.

$$H \otimes CW^T = S \quad (5)$$

The dimension of the vector S is k-by-1. Each element in the vector S is also referred to as a syndrome. If the codeword CW is not a valid codeword, the error detection and calibration circuit 54 may attempt to correct errors (that is, error bits) in the codeword CW through a decoding operation.

Figure 6:
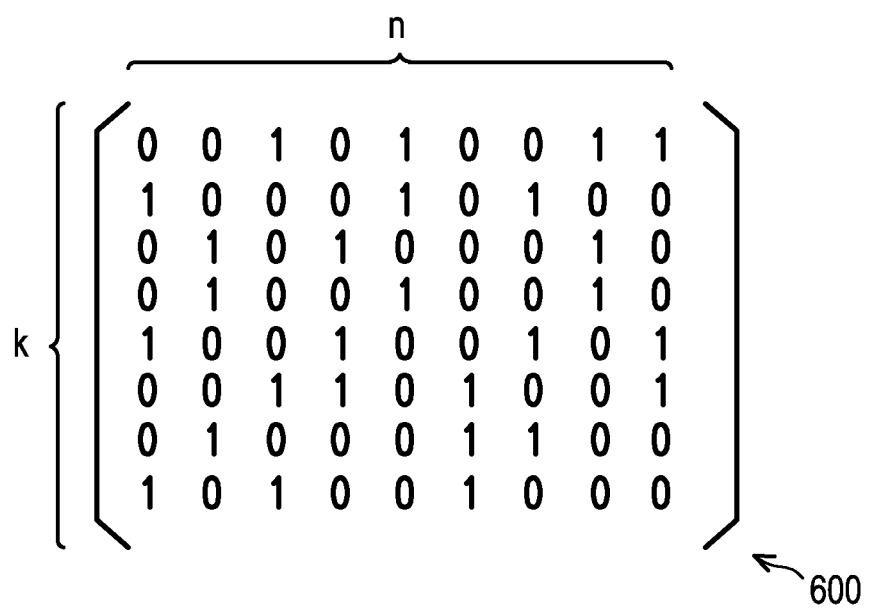
FIG. 6 is a schematic diagram of a parity check matrix according to an exemplary embodiment of the disclosure.

FIG. 6 is a schematic diagram of a parity check matrix according to an exemplary embodiment of the disclosure.

Please refer to FIG. 6. The dimension of a parity check matrix 600 is k-by-n. For example, k is 8 and n is 9. However, the disclosure does not limit the values of the positive integers k and n. Each row of the parity check matrix 600 may represent a constraint. Taking the first row of the parity check matrix 600 as an example, if a certain codeword is a valid codeword, bit "0" will be obtained after performing addition mod 2 on the 3rd, 5th, 8th, and 9th bits in the codeword. Persons with ordinary knowledge in the art should be able to understand how to use the parity check matrix 600 to encode and decode, and details will not be repeated here. In addition, the parity check matrix 600 is just an exemplary matrix and is not intended to limit the disclosure.

When the memory management circuit 51 is to store data (including multiple bits) in the rewritable non-volatile memory module 43, the error detection and calibration circuit 54 may generate k corresponding parity bits for every (n−k) bits (that is, the message bits) in the data. Next, the memory management circuit 51 may write the n bits (that is, the data bits) to the rewritable non-volatile memory module 43 as a codeword.

Figure 7:
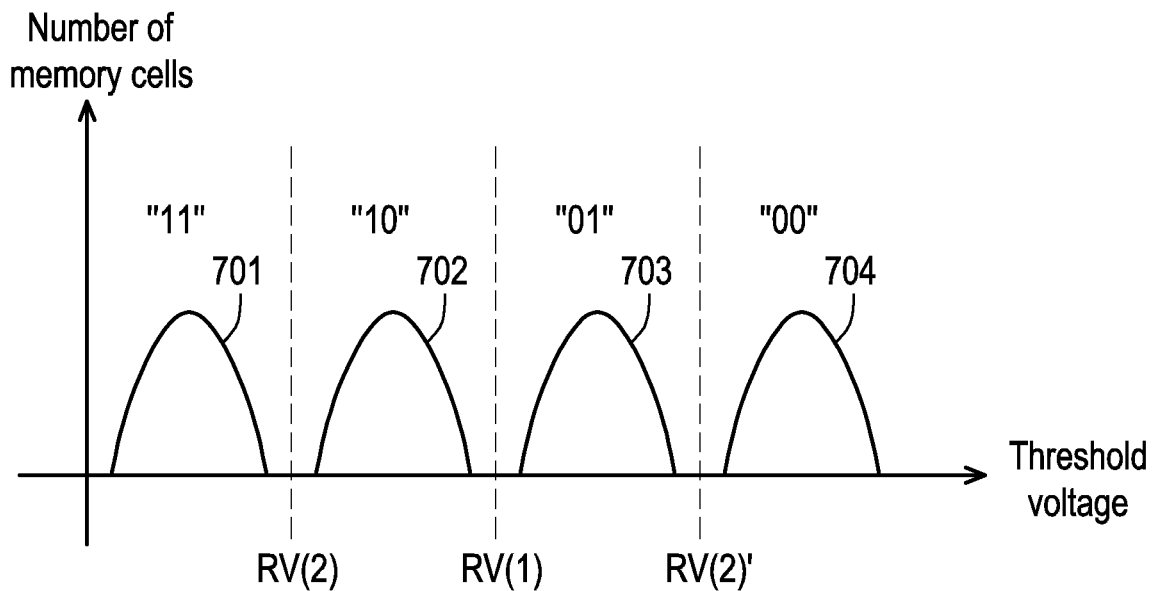
FIG. 7 is a schematic diagram of a threshold voltage distribution of a memory cell according to an exemplary embodiment of the disclosure.

FIG. 7 is a schematic diagram of a threshold voltage distribution of a memory cell according to an exemplary embodiment of the disclosure.

Please refer to FIG. 7. The horizontal axis represents a threshold voltage of the memory cell and the vertical axis represents the number of memory cells. For example, FIG. 7 may represent the threshold voltage of each memory cell in a physical unit (also referred to as a first physical unit) under a healthy status. For example, the first physical unit may include one or more physical programming units.

In an exemplary embodiment, it is assumed that the rewritable non-volatile memory module 43 includes an MLC NAND flash memory module. Therefore, a memory cell in the first physical unit may have 4 statuses 701 to 704. For example, the statuses 701 to 704 respectively correspond to bits "11", "10", "01", and "00". If the threshold voltage of a certain memory cell belongs to the status 701, the memory cell stores bit "11". If the threshold voltage of a certain memory cell belongs to the status 702, the memory cell stores bit "10". If the threshold voltage of a certain memory cell belongs to the status 703, the memory cell stores bit "01". Alternatively, if the threshold voltage of a certain memory cell belongs to the status 704, the memory cell stores bit "00". It should be noted that in other exemplary embodiments, the total number of the statuses 701 to 704 and the bit value corresponding to each status may be adjusted according to practical requirements, and the disclosure is not limited thereto.

When data is to be read from the rewritable non-volatile memory module 43, the memory management circuit 51 may send a read command sequence to the rewritable non-volatile memory module 43. The read command sequence is configured to instruct the rewritable non-volatile memory module 43 to read at least one memory cell (also referred to as a first memory cell) in the first physical unit by using at least one read voltage level to obtain the data stored in the first memory cell. For example, according to the read command sequence, the rewritable non-volatile memory module 43 may read the first memory cell by using read voltage levels RV(1), RV(2), and RV(2)' in FIG. 7. According to whether the read memory cell is switched on by the read voltage levels, the memory management circuit 51 may obtain bit data currently stored in the memory cell. However, as the usage time and/or the usage frequency of the rewritable non-volatile memory module 43 increases, at least some memory cells in the rewritable non-volatile memory module 43 deteriorate.

Figure 8:
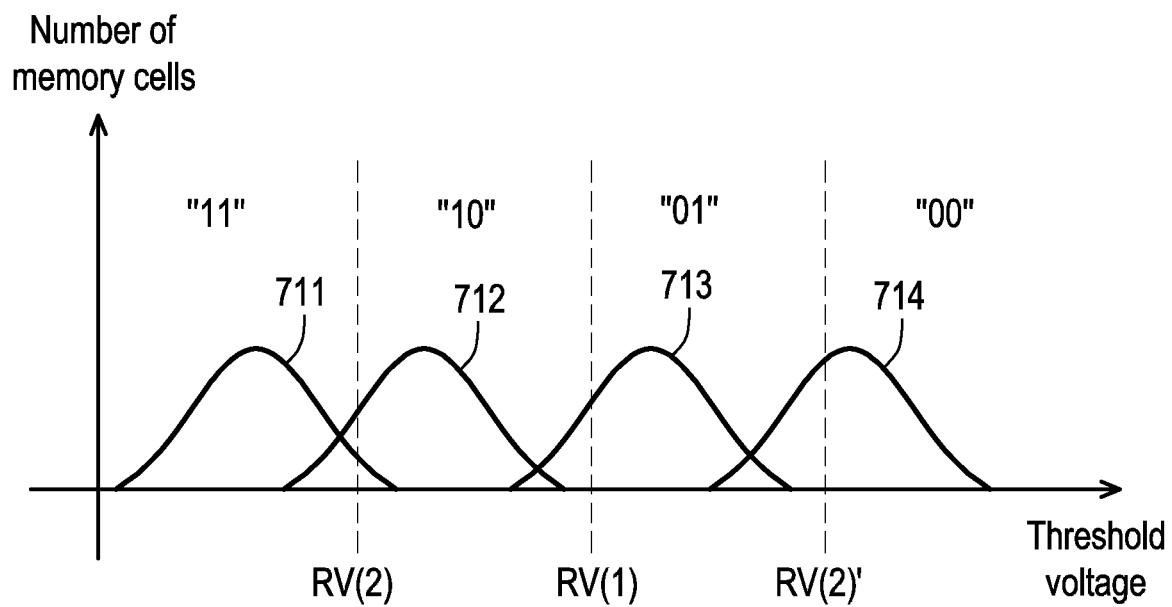
FIG. 8 is a schematic diagram of a threshold voltage distribution of a memory cell after deterioration according to an exemplary embodiment of the disclosure.

FIG. 8 is a schematic diagram of a threshold voltage distribution of a memory cell after deterioration according to an exemplary embodiment of the disclosure.

Please refer to FIG. 8. Statuses 711 to 714 may be configured to represent the statuses 701 to 704 after deterioration. For example, after deterioration, the threshold voltage distributions corresponding to the statuses 711 to 714 shift and/or overlap with each other. At this time, if the data is read from the first memory cell by continuing to use uncalibrated read voltage levels (for example, the read voltage levels RV(1), RV(2), and RV(2)'), the read data may include a large number of error bits. In an exemplary embodiment, the error detection and calibration circuit 54 may decode the read data in an attempt to correct errors in the data. In addition, the error detection and calibration circuit 54 may execute a parity check operation on the read data to confirm whether the read data includes error bits.

FIG. 9 is a schematic diagram of a parity check operation according to an exemplary embodiment of the disclosure.

Please refer to FIG. 9. It is assumed that the data read from the first memory cell includes a codeword 901. In the parity check operation, according to Equation (5), a matrix 900 (that is, the parity check matrix) may be multiplied by the codeword 901 to generate a vector 902 (that is, the vector S). The vector 902 is also referred to as a syndrome vector. Each bit in the codeword 901 corresponds to at least one element (that is, syndrome) in the vector 902. For example, in the codeword 901, a bit $V_0$ (corresponding to the first column in the parity check matrix 900) corresponds to syndromes $S_1$, $S_4$, and $S_7$; a bit $V_1$ (corresponding to the second column in the parity check matrix 900) corresponds to syndromes $S_2$, $S_3$, and $S_6$; and by analogy, a bit $V_8$ (corresponding to the ninth column in the parity check matrix 900) corresponds to syndromes $S_0$, $S_4$, and $S_5$.

If the bit $V_0$ is an error bit, at least one of the syndromes $S_1$, $S_4$, and $S_7$ may be "1". If the bit $V_1$ is an error bit, at least one of the syndromes $S_2$, $S_3$, and $S_6$ may be "1". By analogy, if the bit $V_8$ is an error bit, at least one of the syndromes $S_0$, $S_4$, and $S_5$ may be "1".

In other words, if the syndromes $S_0$ to $S_7$ are all "0", it means that there may be no error bit in the codeword 901, so the error detection and calibration circuit 54 may directly output the codeword 901. However, if there is at least one error bit in the codeword 901, at least one of the syndromes $S_0$ to $S_7$ may be "1", and the error detection and calibration circuit 54 may execute a decoding operation on the codeword 901 to correct the error. In addition, the total number of the syndromes $S_0$ to $S_7$ may be more or less, and the disclosure is not limited thereto.

In an exemplary embodiment, the memory management circuit 51 may instruct the error detection and calibration circuit 54 to decode the data by adopting a hard decoding mode (also referred to as a hard bit decoding mode) or a soft decoding mode (also referred to as a soft bit decoding mode). In the hard decoding mode, when the decoding fails, the memory management circuit 51 may change the read voltage level to read the data again from the first physical unit (or the first memory cell). For example, the memory management circuit 51 may query one or more retry tables to obtain an adjustment parameter of the read voltage level. The adjustment parameter may be configured to adjust the read voltage level. The memory management circuit 51 may read the data again from the first physical unit (or the first memory cell) by using the adjusted read voltage level in an attempt to reduce the error bits included in the data read from the first physical unit (or the first memory cell). However, if the number of error bits included in the data read again is still too many (for example, exceeds the upper limit of the number of error bits that may be calibrated by the error detection and calibration circuit 54), the error detection and calibration circuit 54 may still be unable to successfully decode the data.

In an exemplary embodiment, in the hard decoding mode, if the decoding fails or the number of times of reading the data again exceeds a preset number of times (or the retry table is exhausted), the memory management circuit 51 may instruct the error detection and calibration circuit 54 to enter the soft decoding mode. In the soft decoding mode, more information (also referred to as soft information or soft bits) for assisting in decoding the read data may be obtained, and the error detection and calibration circuit 54 may refer to the information to decode the read data in an attempt to increase the decoding success rate. However, compared with the hard decoding mode, in the soft decoding mode, the time for decoding the data increases significantly. Therefore, how to improve the decoding success rate of the error detection and calibration circuit 54 before entering the soft decoding mode (that is, in the hard decoding mode) is indeed one of the topics that persons skilled in the art are devoted to research on.

In an exemplary embodiment, in the hard decoding mode, the memory management circuit 51 may send multiple read command sequences (also referred to as first read command sequences). For example, the first read command sequences may be sequentially sent to the rewritable non-volatile memory module 43. The first read command sequences may be configured to instruct the rewritable non-volatile memory module 43 to read the data from the first physical unit by sequentially using multiple read voltage levels. Hereinafter, for the convenience of description, the read data instructed by the first read command sequences are collectively referred to as first data. In addition, the memory management circuit 51 may instruct the error detection and calibration circuit 54 to decode (including executing the parity check operation on) the read data.

In an exemplary embodiment, in the hard decoding mode, the memory management circuit 51 may send one of the first read command sequences to instruct the rewritable non-volatile memory module 43 to read the data from the first physical unit by using one of the read voltage levels. The error detection and calibration circuit 54 may decode the read data. If the decoding is successful, the error detection and calibration circuit 54 may output successfully decoded data. If the decoding fails (that is, is unsuccessful), the memory management circuit 51 may send another one of the first read command sequences to instruct the rewritable non-volatile memory module 43 to read the data from the first physical unit by using another one of the read voltage levels. Then, the error detection and calibration circuit 54 may decode the read data again. For example, the read voltage levels may be determined according to the retry table.

In an exemplary embodiment, during the process of decoding the first data, the memory management circuit 51 may obtain and record multiple error evaluation parameters. The error evaluation parameters respectively correspond to one of the read voltage levels. For example, the error evaluation parameters may respectively reflect an error status of the data read by using one of the read voltage levels.

Taking an error evaluation parameter (also referred to as a first error evaluation parameter) corresponding to a certain read voltage level (also referred to as a first read voltage level) among the error evaluation parameters as an example, the first error evaluation parameter may reflect the error status of the data read from the first physical unit by using the first read voltage level in the hard decoding operation executed in the past. For example, the first error evaluation parameter may be positively correlated with the total number of error bits included in the data read from the first physical unit by using the first read voltage level. That is, the greater the value of the first error evaluation parameter, the greater the total number of error bits included in the data read from the first physical unit by using the first read voltage level. However, in an exemplary embodiment, the first error evaluation parameter may also be negatively correlated with the total number of error bits included in the data read from the first physical unit by using the first read voltage level. Alternatively, in an exemplary embodiment, the first error evaluation parameter may also reflect the error status of the data read from the first physical unit by using the first read voltage level in the hard decoding operation executed in the past in other ways, and the disclosure is not limited thereto.

In an exemplary embodiment, the memory management circuit 51 may instruct the error detection and calibration circuit 54 to execute the parity check operation on the first data read by using the first read voltage level to obtain a syndrome sum. Taking FIG. 9 as an example, assuming that the codeword 901 includes the data read from the first physical unit by using the first read voltage level, the memory management circuit 51 may add up the syndromes $S_0$ to $S_7$ in the parity vector 902 to obtain the syndrome sum. Alternatively, from another point of view, the syndrome sum may reflect the sum of the syndromes $S_0$ to $S_7$ in the parity vector 902. The memory management circuit 51 may record the first error evaluation parameter according to the syndrome sum. For example, the memory management circuit 51 may directly set the syndrome sum as the first error evaluation parameter. For example, assuming that the syndrome sum is 500, the memory management circuit 51 may record the first error evaluation parameter as 500. Alternatively, the memory management circuit 51 may also execute a logical operation on the syndrome sum to obtain the first error evaluation parameter, and the disclosure is not limited thereto. By analogy, the memory management circuit 51 may record the error evaluation parameters respectively corresponding to the read voltage levels one by one.

In an exemplary embodiment, the memory management circuit 51 may compare the error evaluation parameters. The memory management circuit 51 may determine one of the error evaluation parameters as the first error evaluation parameter according to the comparison result. For example, the memory management circuit 51 may use an error evaluation parameter with the smallest value among the error evaluation parameters as the first error evaluation parameter according to the comparison result. Alternatively, in an exemplary embodiment, the memory management circuit 51 may use an error evaluation parameter conforming to a specific condition among the error evaluation parameters as the first error evaluation parameter according to the comparison result, and the disclosure is not limited thereto.

In an exemplary embodiment, the memory management circuit 51 may determine a vector distance parameter (also referred to as a first vector distance parameter) according to the first error evaluation parameter. The first vector distance parameter corresponds to the first read voltage level. For example, the memory management circuit 51 may convert the first error evaluation parameter into the first vector distance parameter according to Conversion Function (2.1).

$$f(s) = d \qquad (2.1)$$

In Conversion Function (2.1), the parameter s represents the error evaluation parameter and d represents the vector distance parameter. After substituting the first error evaluation parameter (that is, the parameter s) into Conversion Function (2.1), the first vector distance parameter (that is, the parameter d) may be obtained according to the output of Conversion Function (2.1). In addition, in an exemplary embodiment, Conversion Function (2.1) may also be replaced by a data table (or a conversion table). In this way, the memory management circuit 51 may convert the error evaluation parameter into the vector distance parameter through table lookup or calculation.

In an exemplary embodiment, the memory management circuit 51 may determine multiple read voltage levels (also referred to as candidate read voltage levels) according to the first vector distance parameter and the first read voltage level. For example, a distance (also referred to as a vector distance) between the candidate read voltage level and the first read voltage level may be related to the first vector distance parameter. For example, the vector distance between the candidate read voltage level and the first read voltage level may be positively correlated with the first vector distance parameter.

In an exemplary embodiment, the first vector distance parameter may be configured to determine, control, restrict, or limit the vector distances respectively between the first read voltage level and the candidate read voltage levels. Then, the memory management circuit 51 may determine a read voltage level (also referred to as a target read voltage level) according to one of the candidate read voltage levels. For example, the target read voltage level may include a calibrated read voltage level.

In an exemplary embodiment, after determining the target read voltage level, the memory management circuit 51 may send the read command sequence (also referred to as a second read command sequence) again to the rewritable non-volatile memory module 43. The second read command sequence may be configured to instruct the rewritable non-volatile memory module 43 to read the data (also referred to as second data) from the first physical unit by using the target read voltage level. Then, the error detection and calibration circuit 54 may decode the second data in the hard decoding mode.

In an exemplary embodiment, compared with the first data read from the first physical unit by using the uncalibrated read voltage levels, the total number of error bits included in the second data read from the first physical unit by using the target read voltage level can be effectively reduced. In an exemplary embodiment, compared with the first data, in the hard decoding mode, the decoding success rate of the second data by the error detection and calibration circuit 54 can also be effectively improved. In an exemplary embodiment, before entering the soft decoding mode, the data (that is, the second data) read from the first physical unit may be decoded relatively quickly (in the hard decoding mode), thereby improving the decoding efficiency of the error detection and calibration circuit 54.

In an exemplary embodiment, the memory management circuit 51 may determine a coordinate point (also referred to as a first coordinate point) in a coordinate space according to the first read voltage level. The dimension of the coordinate space is not limited. The memory management circuit 51 may obtain multiple coordinate points (also referred to as second coordinate points) in the coordinate space according to the first coordinate point and the first vector distance parameter. The memory management circuit 51 may determine the candidate read voltage levels according to the second coordinate points. For example, the coordinate position of the first coordinate point in the coordinate space may reflect or correspond to the first read voltage level, and the coordinate position of each second coordinate point in the coordinate space may reflect or correspond to one of the candidate read voltage levels.

In an exemplary embodiment, the first vector distance parameter reflects or corresponds to a distance (also referred to as a first vector distance) in the coordinate space. The memory management circuit 51 may determine the second coordinate point in the coordinate space according to the first coordinate point and the first vector distance. In particular, a vector distance (also referred to as a second vector distance) between the second coordinate point and the first coordinate point in the coordinate space may be equal to, greater than, or smaller than the first vector distance.

In an exemplary embodiment, the memory management circuit 51 may determine the second vector distance according to the first vector distance parameter (or the first vector distance). For example, the memory management circuit 51 may directly set the first vector distance as the second vector distance. Alternatively, the memory management circuit 51 may execute the logical operation on the first vector distance parameter to obtain the second vector distance. In an exemplary embodiment, the memory management circuit 51 may determine the second coordinate point in the coordinate space according to the first coordinate point and the second vector distance.

Figure 10:
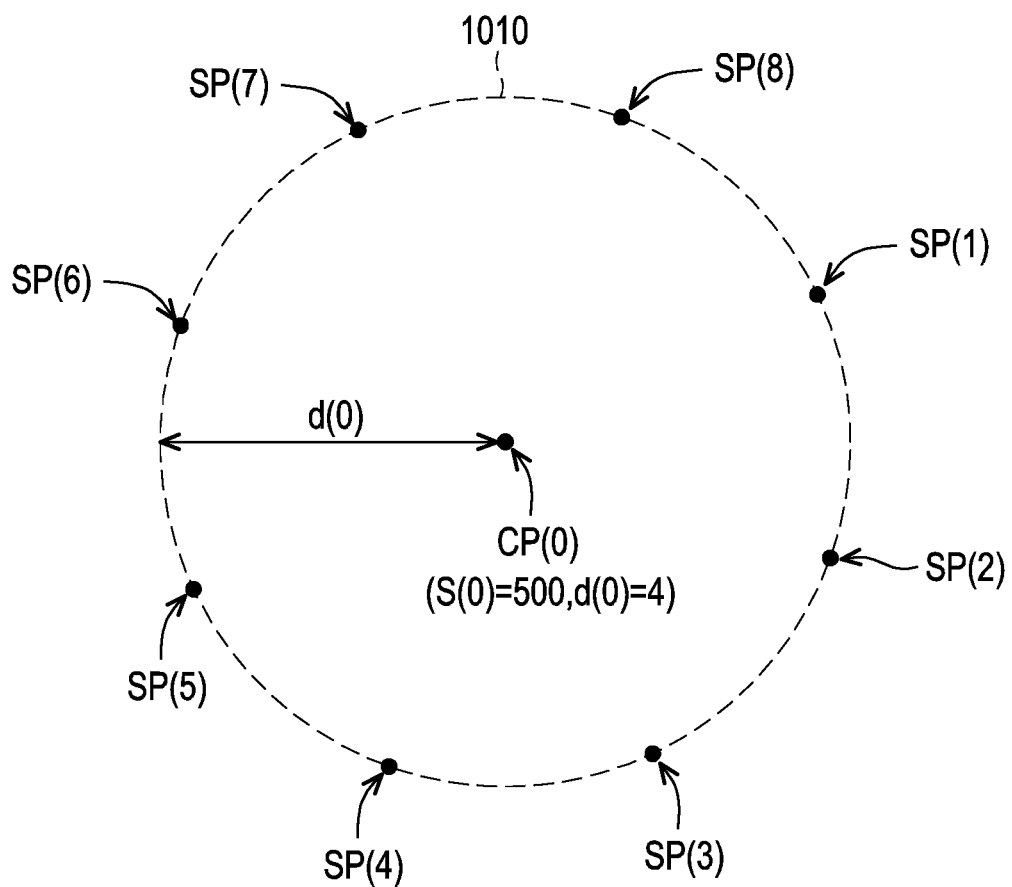
FIG. 10 is a schematic diagram of a first coordinate point and multiple second coordinate points according to an exemplary embodiment of the disclosure.

FIG. 10 is a schematic diagram of a first coordinate point and multiple second coordinate points according to an exemplary embodiment of the disclosure.

Please refer to FIG. 10. It is assumed that a parameter S(0) represents the error evaluation parameter (that is, the first error evaluation parameter) corresponding to the first read voltage level and a parameter d(0) represents the first vector distance parameter. For example, the memory management circuit 51 may obtain the parameter d(0) according to the parameter S(0). For example, the parameter S(0) may be "500" and the parameter d(0) may be "4", and the disclosure is not limited thereto.

In an exemplary embodiment, the memory management circuit 51 may determine a coordinate point CP(0) (that is, the first coordinate point) in the coordinate space according to the first read voltage level. The memory management circuit 51 may determine multiple coordinate points SP(1) to SP(8) (that is, the second coordinate points) in the coordinate space according to the coordinate point CP(0) and the parameter d(0). It should be noted that the total number of the coordinate points SP(1) to SP(8) may be more or less.

In an exemplary embodiment, the distance between each of the coordinate points SP(1) to SP(8) and the coordinate point CP(0) is the same. For example, the distance between each of the coordinate points SP(1) to SP(8) and the coordinate point CP(0) is the vector distance (that is, the first vector distance) corresponding to the parameter d(0). From another point of view, in the exemplary embodiment of FIG. 10, using the coordinate point CP(0) as the center of a circle 1010 and using the vector distance corresponding to the parameter d(0) as the radius of the circle 1010, the coordinate points SP(1) to SP(8) are all located on the circumference of the circle 1010. In particular, the coordinate points SP(1) to SP(8) respectively correspond to one candidate read voltage level.

In an exemplary embodiment, the position of the coordinate point CP(0) in the coordinate space may reflect at least one voltage value of the first read voltage level. Similarly, the positions and the distribution of the coordinate points SP(1) to SP(8) in the coordinate space may reflect the voltage values of the candidate read voltage levels and the distribution of the voltage values.

In an exemplary embodiment, the first read voltage level, the candidate read voltage level, or the remaining read voltage levels may all include a set of voltage values. Taking FIG. 7 as an example, the set of voltage values may include the voltage values of the read voltage levels RV(1), RV(2), and RV(2)' (or the voltage values of the read voltage levels RV(2) and RV(2)'). Assuming that the set of voltage values includes n voltage values V(1) to V(n), the coordinates of any coordinate point in the coordinate space may be expressed as (V(1),V(2), . . . ,V(n)). In addition, assuming that the coordinates of two coordinate points in the coordinate space are respectively (Vi(1), Vi(2), . . . , Vi(n)) and (Vj(1), Vj(2), . . . ,Vj(n)), a distance d(ij) between the two coordinate points may be obtained through Equation (3.1) below.

$$d(ij) = \sqrt{((Vi(1) - Vj(1))^2 + (Vi(2) - Vj(2))^2 + \ldots + (Vi(n) - Vj(n))^2} \quad (3.1)$$

Therefore, in the exemplary embodiment of FIG. 10, the positions and/or the distribution of the coordinate points CP(0) and SP(1) to SP(8) in the coordinate space may reflect the voltage relative relationship between the read voltage levels individually corresponding to the coordinate points CP(0) and SP(1) to SP(8).

In an exemplary embodiment, the memory management circuit 51 may obtain a vector distance parameter (also referred to as a first candidate vector distance parameter) between a certain candidate read voltage level (also referred to as a first candidate read voltage level) among the candidate read voltage levels and another read voltage level (also referred to as the second read voltage level) among the read voltage levels. The second read voltage level is different from the first read voltage level. On the other hand, the memory management circuit 51 may obtain a vector distance parameter (also referred to as a second candidate vector distance parameter) between another candidate read voltage level (also referred to as a second candidate read voltage level) among the candidate read voltage levels and the second read voltage level. The memory management circuit 51 may determine one of the first candidate read voltage level and the second candidate read voltage level as the target read voltage level according to the first candidate vector distance parameter and the second candidate vector distance parameter.

In an exemplary embodiment, the memory management circuit 51 may determine a vector distance parameter (also referred to as a second vector distance parameter) according to an error evaluation parameter (also referred to as a second error evaluation parameter) corresponding to the second read voltage level among the error evaluation parameters. For example, the memory management circuit 51 may determine at least one error evaluation parameter whose value is not the smallest among the error evaluation parameters as the second error evaluation parameter according to the previous comparison result of the error evaluation parameters. Then, the memory management circuit 51 may respectively convert one or more second error evaluation parameters into the corresponding second vector distance parameters according to Conversion Function (2.1).

In an exemplary embodiment, the memory management circuit 51 may obtain a difference value (also referred to as a first difference value) between the first candidate vector distance parameter and the second vector distance parameter. On the other hand, the memory management circuit 51 may obtain a difference value (also referred to as a second difference value) between the second candidate vector distance parameter and the second vector distance parameter. The memory management circuit 51 may determine one of the first candidate read voltage level and the second candidate read voltage level as the target read voltage level according to the first difference value and the second difference value.

In an exemplary embodiment, the memory management circuit 51 may update a difference value sum (also referred to as a first difference value sum) corresponding to the first candidate read voltage level according to the first difference value. On the other hand, the memory management circuit 51 may update a difference value sum (also referred to as a second difference value sum) corresponding to the second candidate read voltage level according to the second difference value. The memory management circuit 51 may determine the first candidate read voltage level or the second candidate read voltage level as the target read voltage level according to the value magnitude relationship between the first difference value sum and the second difference value sum. For example, in response to the first difference value sum being smaller than the second difference value sum, the memory management circuit 51 may determine the first candidate read voltage level as the target read voltage level. Alternatively, in response to the second difference value sum being smaller than the first difference value sum, the memory management circuit 51 may determine the second candidate read voltage level as the target read voltage level.

Figure 11A:
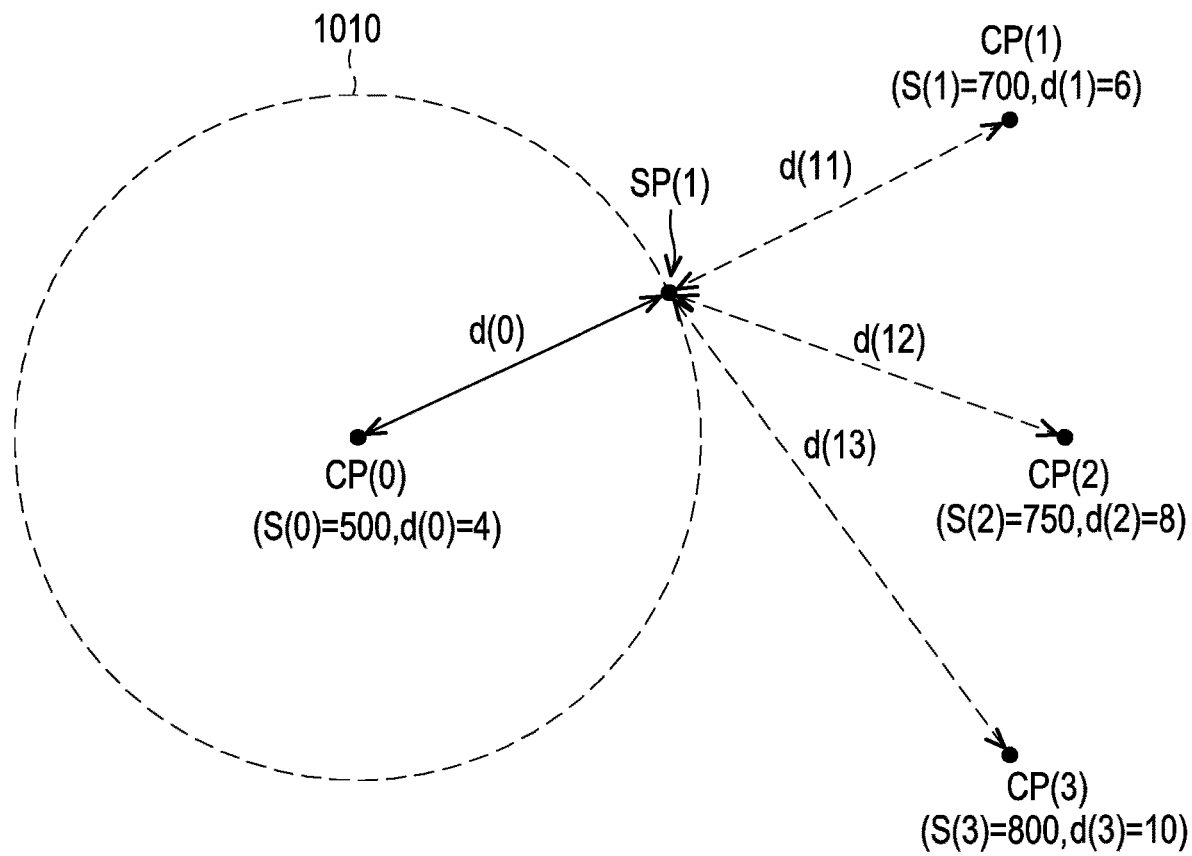
FIG. 11A to FIG. 11C are schematic diagrams of multiple candidate vector distances respectively between multiple candidate read voltage levels and multiple second read voltage levels according to an exemplary embodiment of the disclosure.
Figure 11B:
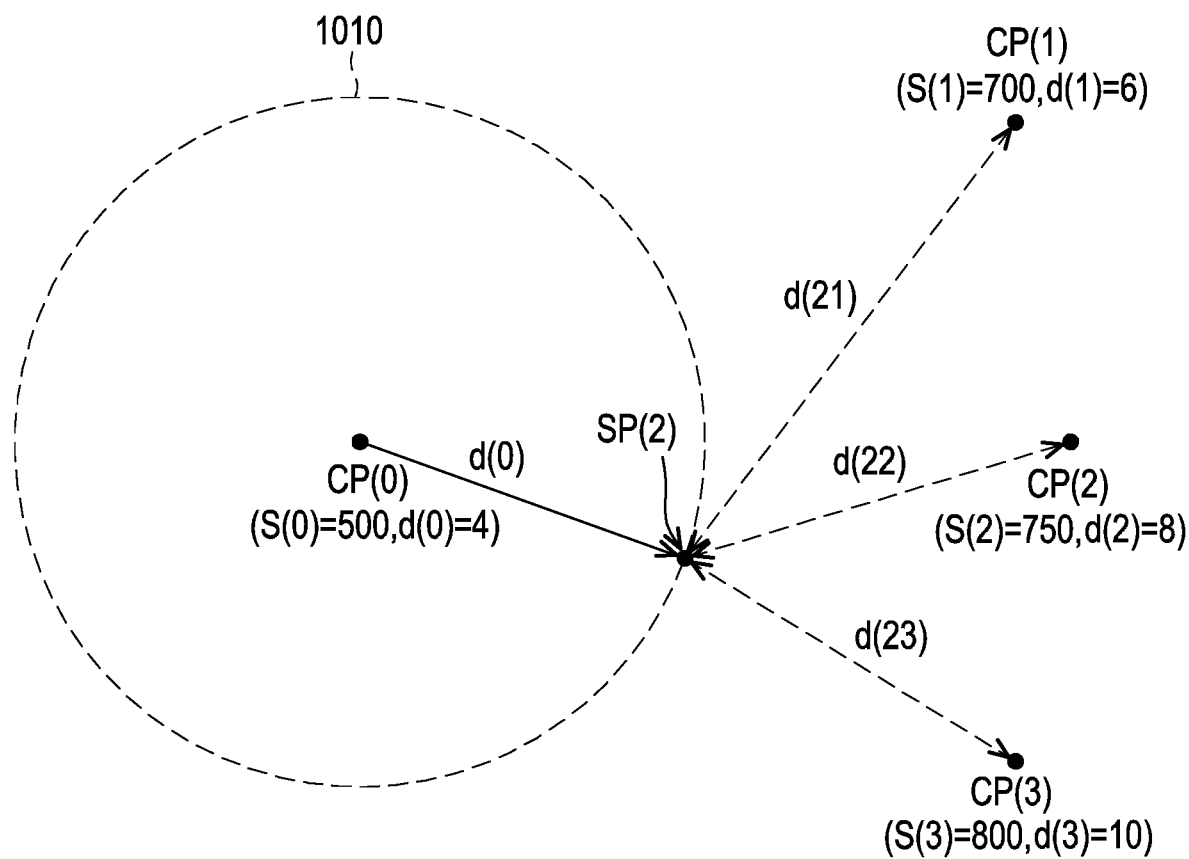
Figure 11C:
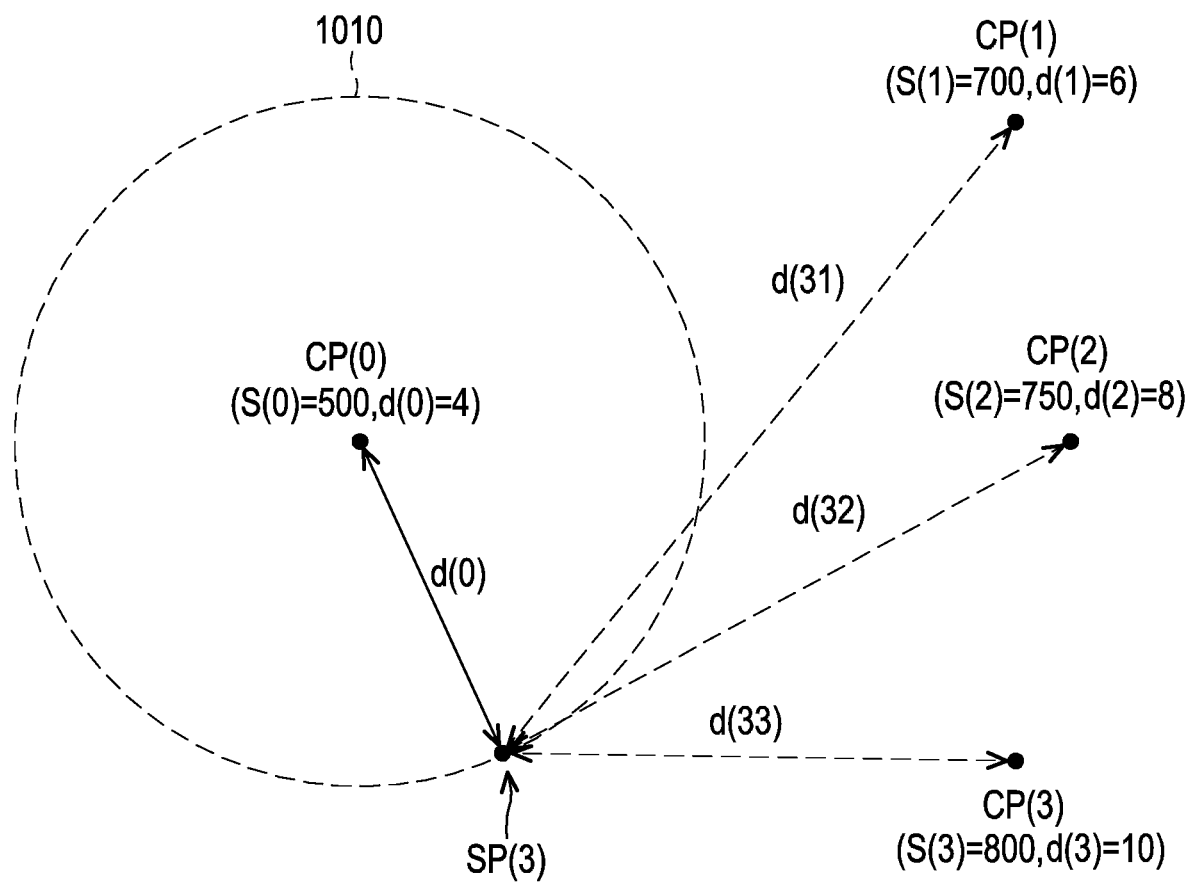

FIG. 11A to FIG. 11C are schematic diagrams of multiple candidate vector distances respectively between multiple candidate read voltage levels and multiple second read voltage levels according to an exemplary embodiment of the disclosure. It should be noted that for the convenience of description, only the coordinate points SP(1) to SP(3) in FIG. 10 are taken as an example for description below.

Please refer to FIG. 11A to FIG. 11C. It is assumed that the coordinate points CP(0) to CP(3) respectively correspond to one read voltage level. In particular, the parameter S(0) (that is, the first error evaluation parameter) corresponding to the read voltage level (that is, the first read voltage level) corresponding to the coordinate point CP(0) (that is, the first coordinate point) is smaller than parameters S(1) to S(3) (that is, the second error evaluation parameters) corresponding to the read voltage levels (that is, the second read voltage levels) corresponding to the coordinate points CP(1) to CP(3) (that is, the second coordinate points). The parameters S(1) to S(3) are all greater than the parameter S(0). In addition, the memory management circuit 51 may respectively convert the parameters S(0) to S(3) into parameters d(0) to d(3) according to Conversion Function (2.1). The parameter d(0) may be regarded as the first vector distance parameter and the parameters d(1) to d(3) may be regarded as the second vector distance parameters. For example, assuming that the parameters S(0) to S(3) are respectively "500", "700", "750", and "800", the parameters d(0) to d(3) may respectively be "4", "6", "8", and "10".

In the exemplary embodiment of FIG. 11A, the memory management circuit 51 may obtain parameters d(11) to d(13) (that is, candidate vector distance parameters) according to Equation (3.1). The parameter d(11) reflects the vector distance between the coordinate point SP(1) and the coordinate point CP(1). The parameter d(12) reflects the vector distance between the coordinate point SP(1) and the coordinate point CP(2). The parameter d(13) reflects the vector distance between the coordinate point SP(1) and the coordinate point CP(3). In addition, the memory management circuit 51 may obtain a difference value $\Delta(11)$ between the parameter d(11) and the parameter d(1), a difference value $\Delta(12)$ between the parameter d(12) and the parameter d(2), and a difference value $\Delta(13)$ between the parameter d(13) and the parameter d(3). For example, $\Delta(11)=|d(11)-d(1)|$, $\Delta(12)=|d(12)-d(2)|$, and $\Delta(13)=|d(13)-d(3)|$. Then, the memory management circuit 51 may obtain a difference value sum $\Delta SUM(1)$ corresponding to the coordinate point SP(1) according to the difference values $\Delta(11)$ to $\Delta(13)$. For example, $$\Delta SUM(1) = \Delta(11) + \Delta(12) + \Delta(13).$$

In the exemplary embodiment of FIG. 11B, the memory management circuit 51 may obtain parameters d(21) to d(23) according to Equation (3.1). The parameter d(21) reflects the vector distance between the coordinate point SP(2) and the coordinate point CP(1). The parameter d(22) reflects the vector distance between the coordinate point SP(2) and the coordinate point CP(2). The parameter d(23) reflects the vector distance between the coordinate point SP(2) and the coordinate point CP(3). In addition, the memory management circuit 51 may obtain a difference value $\Delta(21)$ between the parameter d(21) and the parameter d(1), a difference value $\Delta(22)$ between the parameter d(22) and the parameter d(2), and a difference value $\Delta(23)$ between the parameter d(23) and the parameter d(3). For example, $\Delta(21)=|d(21)-d(1)|$, $\Delta(22)=|d(22)-d(2)|$, and $\Delta(23)=|d(23)-d(3)|$. Then, the memory management circuit 51 may obtain a difference value sum $\Delta SUM(2)$ corresponding to the coordinate point SP(2) according to the difference values $\Delta(21)$ to $\Delta(23)$. For example, $\Delta SUM(2)=\Delta(21)+\Delta(22)+\Delta(23)$.

In the exemplary embodiment of FIG. 11C, the memory management circuit 51 may obtain parameters d(31) to d(33) according to Equation (3.1). The parameter d(31) reflects the vector distance between the coordinate point SP(3) and the coordinate point CP(1). The parameter d(32) reflects the vector distance between the coordinate point SP(3) and the coordinate point CP(2). The parameter d(33) reflects the vector distance between the coordinate point SP(3) and the coordinate point CP(3). In addition, the memory management circuit 51 may obtain a difference value Δ(31) between the parameter d(31) and the parameter d(1), a difference value Δ(32) between the parameter d(32) and the parameter d(2), and a difference value Δ(33) between the parameter d(33) and the parameter d(3). For example, Δ(31)=|d(31)−d(1)|, Δ(32)=|d(32)−d(2)|, and Δ(33)=|d(33)−d(3)|. Then, the memory management circuit 51 may obtain a difference value sum ΔSUM(3) corresponding to the coordinate point SP(3) according to the difference values Δ(31) to Δ(33). For example, ΔSUM(3)=Δ(31)+Δ(32)+Δ(33).

In an exemplary embodiment, the memory management circuit 51 may determine the candidate read voltage level corresponding to one of the coordinate points SP(1) to SP(3) as the target read voltage level according to the difference value sums ΔSUM(1) to ΔSUM(3). For example, the memory management circuit 51 may compare the difference value sums ΔSUM(1) to ΔSUM(3). If the comparison result reflects that the difference value sum ΔSUM(1) is smaller than the difference value sums ΔSUM(2) and ΔSUM(3), the memory management circuit 51 may determine the candidate read voltage level corresponding to the coordinate point SP(1) as the target read voltage level. If the comparison result reflects that the difference value sum ΔSUM(2) is smaller than the difference value sums ΔSUM(1) and ΔSUM(3), the memory management circuit 51 may determine the candidate read voltage level corresponding to the coordinate point SP(2) as the target read voltage level. Alternatively, if the comparison result reflects that the difference value sum ΔSUM(3) is smaller than the difference value sums ΔSUM(1) and ΔSUM(2), the memory management circuit 51 may determine the candidate read voltage level corresponding to the coordinate point SP(3) as the target read voltage level.

It should be noted that in the exemplary embodiments of FIG. 10 to FIG. 11C, it is assumed that the vector distance between each of the second coordinate points (for example, the coordinate points SP(1) to SP(8)) and the first coordinate point (for example, the coordinate point CP(0)) is the same. However, in an exemplary embodiment, there may be different vector distances between at least part of the second coordinate points and the first coordinate point.

Figure 12:
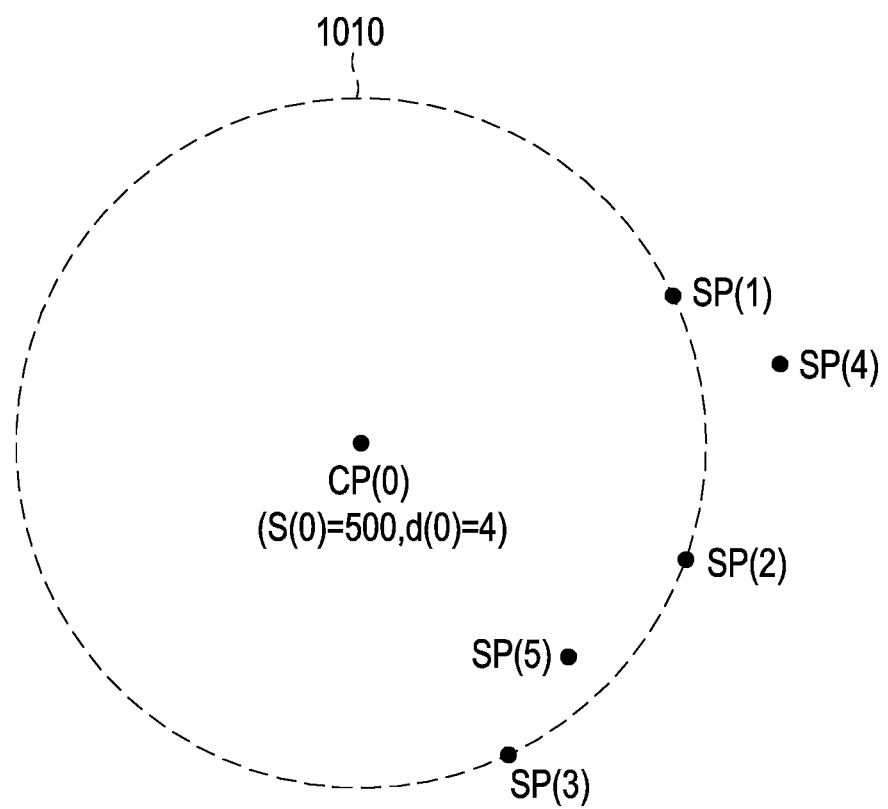
FIG. 12 is a schematic diagram of a first coordinate point and multiple second coordinate points according to an exemplary embodiment of the disclosure.

FIG. 12 is a schematic diagram of a first coordinate point and multiple second coordinate points according to an exemplary embodiment of the disclosure.

Please refer to FIG. 12. It is assumed that the coordinate point CP(0) is the first coordinate point and the coordinate points SP(1) to SP(5) belong to the second coordinate points. However, compared with the exemplary embodiment of FIG. 10, in the exemplary embodiment of FIG. 12, the coordinate points SP(4) and SP(5) may not be located on the circumference of the circle 1010. For example, the vector distance between the coordinate point SP(4) and the coordinate point CP(0) may be greater than the vector distances respectively between the coordinate points SP(1) to SP(3) and the coordinate point CP(0). The vector distance between the coordinate point SP(5) and the coordinate point CP(0) may be smaller than the vector distances respectively between the coordinate points SP(1) to SP(3) and the coordinate point CP(0).

Figure 13A:
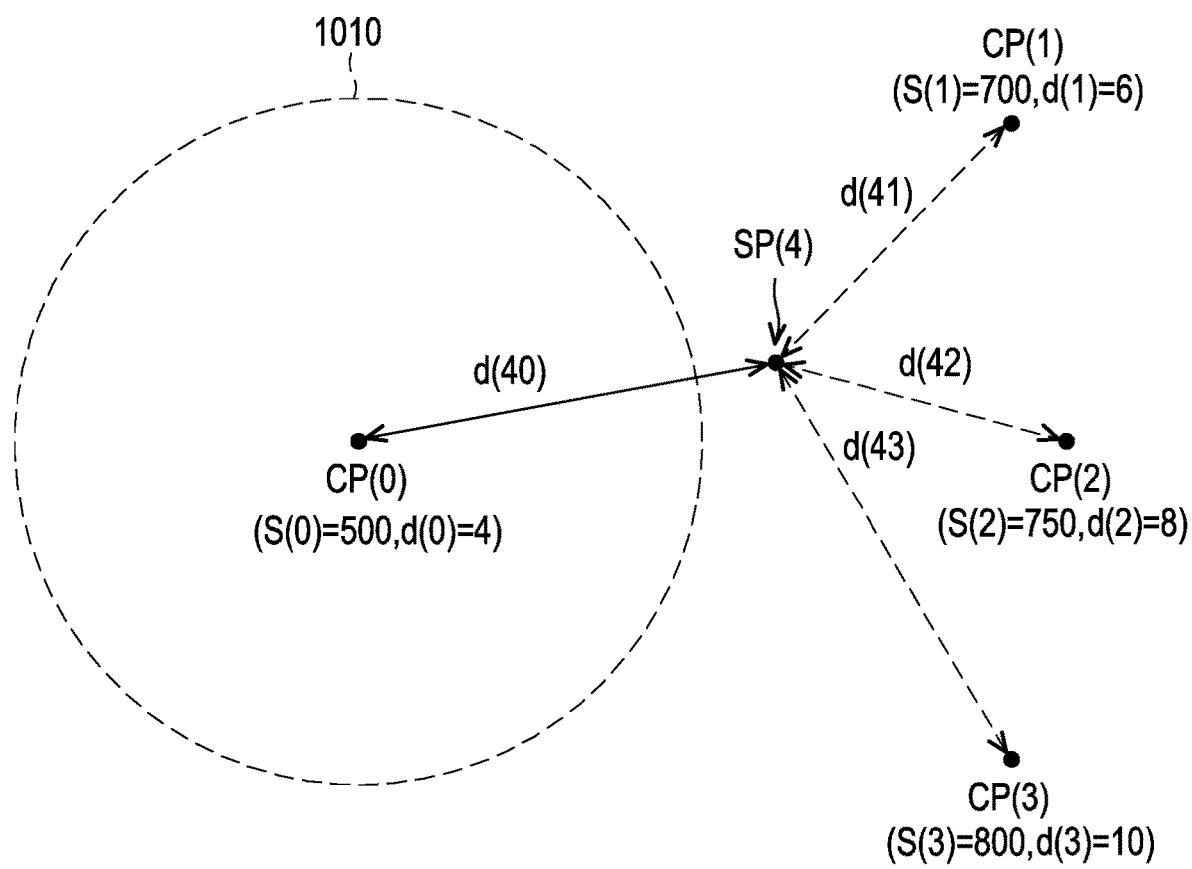
FIG. 13A and FIG. 13B are schematic diagrams of multiple candidate vector distances respectively between multiple candidate read voltage levels and multiple second read voltage levels according to an exemplary embodiment of the disclosure.
Figure 13B:
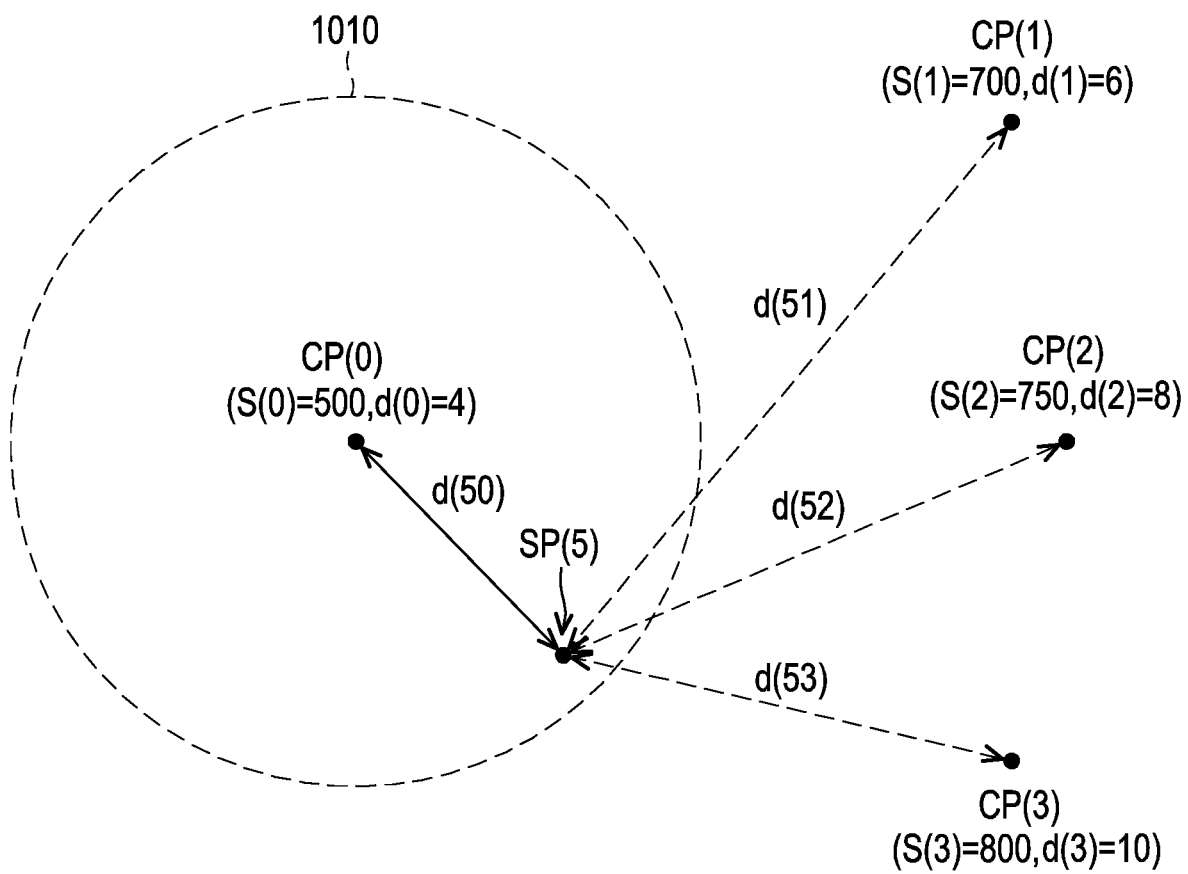

FIG. 13A and FIG. 13B are schematic diagrams of multiple candidate vector distances respectively between multiple candidate read voltage levels and multiple second read voltage levels according to an exemplary embodiment of the disclosure. It should be noted that for convenience of description, only the coordinate points SP(4) and SP(5) in FIG. 12 are taken as an example for description.

Please refer to FIG. 13A and FIG. 13B. Compared with FIG. 11A to FIG. 11C, in the exemplary embodiment of FIG. 13A, the memory management circuit 51 may obtain parameters d(40) to d(43) (that is, the candidate vector distance parameters) according to Equation (3.1). The parameter d(40) reflects the vector distance between the coordinate point SP(4) and the coordinate point CP(0). The parameter d(41) reflects the vector distance between the coordinate point SP(4) and the coordinate point CP(1). The parameter d(42) reflects the vector distance between the coordinate point SP(4) and the coordinate point CP(2). The parameter d(43) reflects the vector distance between the coordinate point SP(4) and the coordinate point CP(3). In addition, the memory management circuit 51 may obtain a difference value Δ(40) between the parameter d(40) and the parameter d(0), a difference value Δ(41) between the parameter d(41) and the parameter d(1), a difference value Δ(42) between the parameter d(42) and the parameter d(2), and a difference value Δ(43) between the parameter d(43) and the parameter d(3). For example, A (40)=|d(40)−d(0)|, Δ(41)=|d(41)−d(1)|, Δ(42)=|d(42)−d(2)|, and Δ(43)=|d(43)−d(3)|. Then, the memory management circuit 51 may obtain a difference value sum ΔSUM(4) corresponding to the coordinate point SP(4) according to the difference values Δ(40) to Δ(43). For example, ΔSUM(4)−Δ(40)+Δ(41)+4(42)+Δ(43).

In the exemplary embodiment of FIG. 13B, the memory management circuit 51 may obtain parameters d(50) to d(53) (that is, the candidate vector distance parameters) according to Equation (3.1). The parameter d(50) reflects the vector distance between the coordinate point SP(5) and the coordinate point CP(0). The parameter d(51) reflects the vector distance between the coordinate point SP(5) and the coordinate point CP(1). The parameter d(52) reflects the vector distance between the coordinate point SP(5) and the coordinate point CP(2). The parameter d(53) reflects the vector distance between the coordinate point SP(5) and the coordinate point CP(3). In addition, the memory management circuit 51 may obtain a difference value Δ(50) between the parameter d(50) and the parameter d(0), a difference value Δ(51) between the parameter d(51) and the parameter d(1), a difference value Δ(52) between the parameter d(52) and the parameter d(2), and a difference value Δ(53) between the parameter d(53) and the parameter d(3). For example, Δ(50)=|d(50)−d(0)|, Δ(51)=|d(51)−d(1)|, Δ(52)=|d(52)−d(2)|, and Δ(53)=|d(53)−d(3)|. Then, the memory management circuit 51 may obtain a difference value sum ΔSUM(5) corresponding to the coordinate point SP(5) according to the difference values Δ(50) to Δ(53). For example, ΔSUM(5)=Δ(50)+Δ(51)+Δ(52)+Δ(53). Then, the memory management circuit 51 may determine the target read voltage level according to the minimum difference value sum among the difference value sums ΔSUM(1) to ΔSUM(5). Relevant operation details have been described in detail above and will not be repeated here.

It should be noted that the foregoing exemplary embodiments only use 3 to 5 second coordinate points in conjunction with 3 second read voltage levels as an example to illustrate how to select the most appropriate coordinate point from multiple second coordinate points to determine the target read voltage level. However, the same or similar operations may be applied to usage scenarios where more or less second coordinate points are adopted in conjunction with more or less second read voltage levels to determine the target read voltage level. Relevant operation details have been described in detail above and will not be repeated here.

Figure 14:
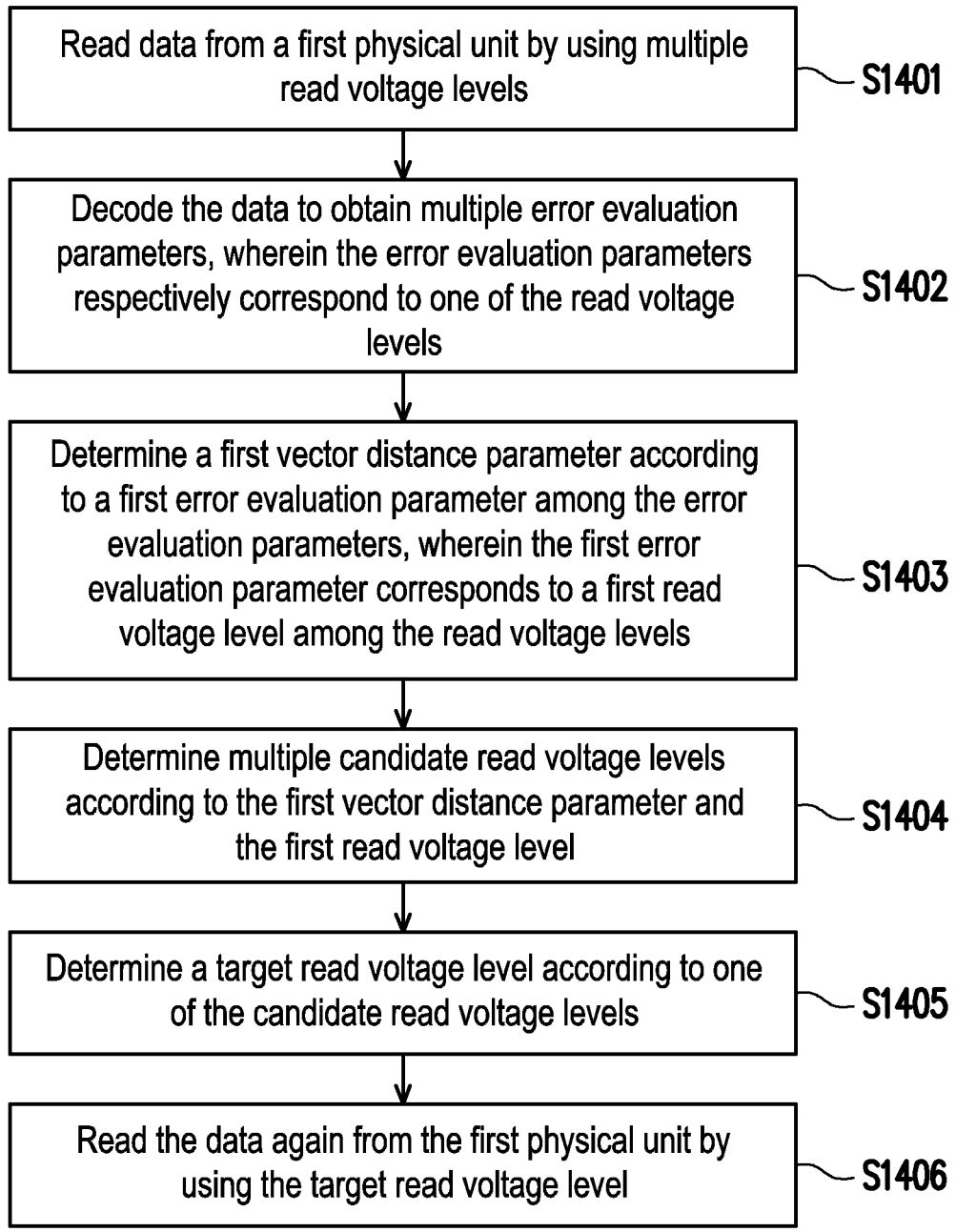
FIG. 14 is a flowchart of a read voltage calibration method according to an exemplary embodiment of the disclosure.

FIG. 14 is a flowchart of a read voltage calibration method according to an exemplary embodiment of the disclosure.

Please refer to FIG. 14. In Step S1401, data is read from a first physical unit by using multiple read voltage levels. In Step S1402, the data is decoded to obtain multiple error evaluation parameters, wherein the error evaluation parameters respectively correspond to one of the read voltage levels. In Step S1403, a first vector distance parameter is determined according to a first error evaluation parameter among the error evaluation parameters, wherein the first error evaluation parameter corresponds to a first read voltage level among the read voltage levels. In Step S1404, multiple candidate read voltage levels are determined according to the first vector distance parameter and the first read voltage level. In Step S1405, a target read voltage level is determined according to one of the candidate read voltage levels. In Step S1406, the data is read again from the first physical unit by using the target read voltage level.

Figure 15:
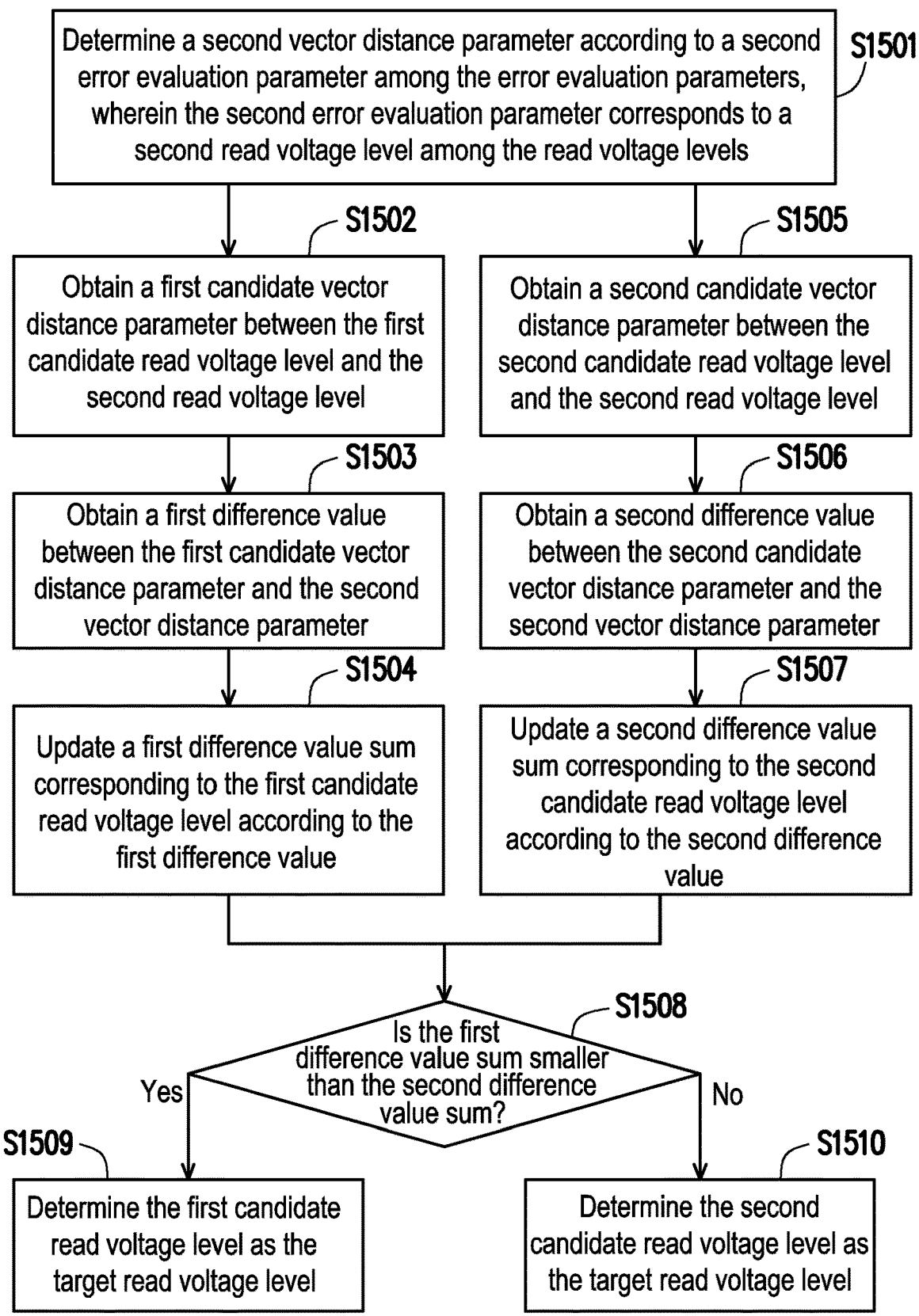
FIG. 15 is a flowchart of a read voltage calibration method according to an exemplary embodiment of the disclosure.

FIG. 15 is a flowchart of a read voltage calibration method according to an exemplary embodiment of the disclosure.

Please refer to FIG. 15. In Step S1501, a second vector distance parameter is determined according to a second error evaluation parameter among the error evaluation parameters, wherein the second error evaluation parameter corresponds to a second read voltage level among the read voltage levels.

In Step S1502, a first candidate vector distance parameter between the first candidate read voltage level and the second read voltage level is obtained. In Step S1503, a first difference value between the first candidate vector distance parameter and the second vector distance parameter is obtained. In Step S1504, a first difference value sum corresponding to the first candidate read voltage level is updated according to the first difference value.

On the other hand, in Step S1505, a second candidate vector distance parameter between the second candidate read voltage level and the second read voltage level is obtained. In Step S1506, a second difference value between the second candidate vector distance parameter and the second vector distance parameter is obtained. In Step S1507, a second difference value sum corresponding to the second candidate read voltage level is updated according to the second difference value.

In Step S1508, it is judged whether the first difference value sum is smaller than the second difference value sum. In response to the first difference value sum being smaller than the second difference value sum, in Step S1509, the first candidate read voltage level is determined as the target read voltage level. Alternatively, in response to the first difference value sum being not smaller than the second difference value sum (or the second difference value sum being greater than the first difference value sum), in Step S1510, the second candidate read voltage level is determined as the target read voltage level.

However, each step in FIG. 14 and FIG. 15 has been described in detail above and will not be repeated here. It should be noted that each step in FIG. 14 and FIG. 15 may be implemented as multiple codes or circuits, and the disclosure is not limited thereto. In addition, the methods shown in FIG. 14 and FIG. 15 may be used in combination with the above exemplary embodiments or may be used alone, and the disclosure is not limited thereto.

In summary, the read voltage calibration method, the memory storage device, and the memory control circuit unit provided by the exemplary embodiments of the disclosure may determine the candidate read voltage levels according to the error evaluation parameters corresponding to different read voltage levels. Then, the target read voltage level may be determined according to the distribution of the coordinate points corresponding to the candidate read voltage levels in the coordinate space. In this way, the calibration efficiency of the read voltage level can be effectively increased.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A read voltage calibration method, used for a rewritable non-volatile memory module, wherein the rewritable non-volatile memory module comprises a plurality of physical units, the read voltage calibration method comprising:
   reading data from a first physical unit among the physical units by using a plurality of read voltage levels;
   decoding the data to obtain a plurality of error evaluation parameters, wherein the error evaluation parameters respectively correspond to one of the read voltage levels;
   determining a first vector distance parameter according to a first error evaluation parameter among the plurality of error evaluation parameters, wherein the first error evaluation parameter corresponds to a first read voltage level among the read voltage levels;
   determining a plurality of candidate read voltage levels according to the first vector distance parameter and the first read voltage level;
   determining a target read voltage level according to one of the candidate read voltage levels; and
   reading the data again from the first physical unit by using the target read voltage level.

2. The read voltage calibration method according to claim 1, wherein the step of decoding the data to obtain the plurality of error evaluation parameters comprises:
   executing a parity check operation on data read by using the first read voltage level in the data to obtain a syndrome sum; and
   obtaining the first error evaluation parameter according to the syndrome sum.

3. The read voltage calibration method according to claim 1, further comprising:
   comparing the error evaluation parameters; and
   determining one of the error evaluation parameters as the first error evaluation parameter according to a comparison result.

4. The read voltage calibration method according to claim 1, wherein the step of determining the first vector distance parameter according to the first error evaluation parameter among the plurality of error evaluation parameters comprises:
   converting the first error evaluation parameter into the first vector distance parameter according to a conversion function.

5. The read voltage calibration method according to claim 1, wherein the step of determining the candidate read voltage levels according to the first vector distance parameter and the first read voltage level comprises:
   determining a first coordinate point in a coordinate space according to the first read voltage level;

obtaining a plurality of second coordinate points in the coordinate space according to the first coordinate point and the first vector distance parameter; and determining the candidate read voltage levels according to the second coordinate points.

6. The read voltage calibration method according to claim 1, wherein the plurality of candidate read voltage levels comprise a first candidate read voltage level and a second candidate read voltage level, and the step of determining the target read voltage level according to the one of the candidate read voltage levels comprises:

obtaining a first candidate vector distance parameter between the first candidate read voltage level and a second read voltage level among the read voltage levels;

obtaining a second candidate vector distance parameter between the second candidate read voltage level and the second read voltage level; and determining one of the first candidate read voltage level and the second candidate read voltage level as the target read voltage level according to the first candidate vector distance parameter and the second candidate vector distance parameter.

7. The read voltage calibration method according to claim 6, wherein the step of determining the one of the first candidate read voltage level and the second candidate read voltage level as the target read voltage level according to the first candidate vector distance parameter and the second candidate vector distance parameter comprises:

determining a second vector distance parameter according to a second error evaluation parameter among the plurality of error evaluation parameters, wherein the second error evaluation parameter corresponds to the second read voltage level;

obtaining a first difference value between the first candidate vector distance parameter and the second vector distance parameter;

obtaining a second difference value between the second candidate vector distance parameter and the second vector distance parameter; and determining the one of the first candidate read voltage level and the second candidate read voltage level as the target read voltage level according to the first difference value and the second difference value.

8. The read voltage calibration method according to claim 7, wherein the step of determining the one of the first candidate read voltage level and the second candidate read voltage level as the target read voltage level according to the first difference value and the second difference value comprises:

obtaining a first difference value sum corresponding to the first candidate read voltage level according to the first difference value;

obtaining a second difference value sum corresponding to the second candidate read voltage level according to the second difference value;

determining the first candidate read voltage level as the target read voltage level in response to the first difference value sum being smaller than the second difference value sum; and determining the second candidate read voltage level as the target read voltage level in response to the second difference value sum being smaller than the first difference value sum.

9. A memory storage device, comprising:
a connection interface unit, used to couple to a host system;

a rewritable non-volatile memory module, wherein the rewritable non-volatile memory module comprises a plurality of physical units; and a memory control circuit unit, coupled to the connection interface unit and the rewritable non-volatile memory module, wherein the memory control circuit unit is configured to:
send a plurality of first read command sequences, wherein the first read command sequences are configured to instruct to read data from a first physical unit among the physical units by using a plurality of read voltage levels;

decode the data to obtain a plurality of error evaluation parameters, wherein the error evaluation parameters respectively correspond to one of the read voltage levels;

determine a first vector distance parameter according to a first error evaluation parameter among the plurality of error evaluation parameters, wherein the first error evaluation parameter corresponds to a first read voltage level among the read voltage levels;

determine a plurality of candidate read voltage levels according to the first vector distance parameter and the first read voltage level;

determine a target read voltage level according to one of the candidate read voltage levels; and send a second read command sequence, wherein the second read command sequence is configured to instruct to read the data again from the first physical unit by using the target read voltage level.

10. The memory storage device according to claim 9, wherein the operation of the memory control circuit unit decoding the data to obtain the plurality of error evaluation parameters comprises:

executing a parity check operation on data read by using the first read voltage level in the data to obtain a syndrome sum; and obtaining the first error evaluation parameter according to the syndrome sum.

11. The memory storage device according to claim 9, wherein the memory control circuit unit is further configured to:

compare the error evaluation parameters; and
determine one of the error evaluation parameters as the first error evaluation parameter according to a comparison result.

12. The memory storage device according to claim 9, wherein the operation of the memory control circuit unit determining the first vector distance parameter according to the first error evaluation parameter among the plurality of error evaluation parameters comprises:

converting the first error evaluation parameter into the first vector distance parameter according to a conversion function.

13. The memory storage device according to claim 9, wherein the operation of the memory control circuit unit determining the candidate read voltage levels according to the first vector distance parameter and the first read voltage level comprises:

determining a first coordinate point in a coordinate space according to the first read voltage level;

obtaining a plurality of second coordinate points in the coordinate space according to the first coordinate point and the first vector distance parameter; and determining the candidate read voltage levels according to the second coordinate points.

14. The memory storage device according to claim 9, wherein the plurality of candidate read voltage levels comprise a first candidate read voltage level and a second candidate read voltage level, and the operation of the memory control circuit unit determining the target read voltage level according to the one of the candidate read voltage levels comprises:
   obtaining a first candidate vector distance parameter between the first candidate read voltage level and a second read voltage level among the read voltage levels;
   obtaining a second candidate vector distance parameter between the second candidate read voltage level and the second read voltage level; and
   determining one of the first candidate read voltage level and the second candidate read voltage level as the target read voltage level according to the first candidate vector distance parameter and the second candidate vector distance parameter.

15. The memory storage device according to claim 14, wherein the operation of the memory control circuit unit determining the one of the first candidate read voltage level and the second candidate read voltage level as the target read voltage level according to the first candidate vector distance parameter and the second candidate vector distance parameter comprises:
   determining a second vector distance parameter according to a second error evaluation parameter among the plurality of error evaluation parameters, wherein the second error evaluation parameter corresponds to the second read voltage level;
   obtaining a first difference value between the first candidate vector distance parameter and the second vector distance parameter;
   obtaining a second difference value between the second candidate vector distance parameter and the second vector distance parameter; and
   determining the one of the first candidate read voltage level and the second candidate read voltage level as the target read voltage level according to the first difference value and the second difference value.

16. The memory storage device according to claim 15, wherein the operation of the memory control circuit unit determining the one of the first candidate read voltage level and the second candidate read voltage level as the target read voltage level according to the first difference value and the second difference value comprises:
   obtaining a first difference value sum corresponding to the first candidate read voltage level according to the first difference value;
   obtaining a second difference value sum corresponding to the second candidate read voltage level according to the second difference value;
   determining the first candidate read voltage level as the target read voltage level in response to the first difference value sum being smaller than the second difference value sum; and
   determining the second candidate read voltage level as the target read voltage level in response to the second difference value sum being smaller than the first difference value sum.

17. A memory control circuit unit, configured to control a rewritable non-volatile memory module, the memory control circuit unit comprising:
   a host interface, configured to couple to a host system;
   a memory interface, configured to couple to the rewritable non-volatile memory module, wherein the rewritable non-volatile memory module comprises a plurality of physical units;
   an error detection and calibration circuit; and
   a memory management circuit, coupled to the host interface, the memory interface, and the error detection and calibration circuit,
   wherein the memory management circuit is configured to:
      send a plurality of first read command sequences, wherein the first read command sequences are configured to instruct to read data from a first physical unit among the physical units by using a plurality of read voltage levels;
      instruct the error detection and calibration circuit to decode the data to obtain a plurality of error evaluation parameters, wherein the error evaluation parameters respectively correspond to one of the read voltage levels;
      determine a first vector distance parameter according to a first error evaluation parameter among the plurality of error evaluation parameters, wherein the first error evaluation parameter corresponds to a first read voltage level among the read voltage levels;
      determine a plurality of candidate read voltage levels according to the first vector distance parameter and the first read voltage level;
      determine a target read voltage level according to one of the candidate read voltage levels; and
      send a second read command sequence, wherein the second read command sequence is configured to instruct to read the data again from the first physical unit by using the target read voltage level.

18. The memory control circuit unit according to claim 17, wherein the operation of the memory management circuit instructing the error detection and calibration circuit to decode the data to obtain the plurality of error evaluation parameters comprises:
   instructing the error detection and calibration circuit to execute a parity check operation on data read by using the first read voltage level in the data to obtain a syndrome sum; and
   obtaining the first error evaluation parameter according to the syndrome sum.

19. The memory control circuit unit according to claim 17, wherein the memory management circuit is further configured to:
   compare the error evaluation parameters; and
   determine one of the error evaluation parameters as the first error evaluation parameter according to a comparison result.

20. The memory control circuit unit according to claim 17, wherein the operation of the memory management circuit determining the first vector distance parameter according to the first error evaluation parameter among the plurality of error evaluation parameters comprises:
   converting the first error evaluation parameter into the first vector distance parameter according to a conversion function.

21. The memory control circuit unit according to claim 17, wherein the operation of the memory management circuit determining the candidate read voltage levels according to the first vector distance parameter and the first read voltage level comprises:
   determining a first coordinate point in a coordinate space according to the first read voltage level;

obtaining a plurality of second coordinate points in the coordinate space according to the first coordinate point and the first vector distance parameter; and determining the candidate read voltage levels according to the second coordinate points.

22. The memory control circuit unit according to claim 17, wherein the plurality of candidate read voltage levels comprise a first candidate read voltage level and a second candidate read voltage level, and the operation of the memory management circuit determining the target read voltage level according to the one of the candidate read voltage levels comprises:

obtaining a first candidate vector distance parameter between the first candidate read voltage level and a second read voltage level among the read voltage levels;

obtaining a second candidate vector distance parameter between the second candidate read voltage level and the second read voltage level; and determining one of the first candidate read voltage level and the second candidate read voltage level as the target read voltage level according to the first candidate vector distance parameter and the second candidate vector distance parameter.

23. The memory control circuit unit according to claim 22, wherein the operation of the memory management circuit determining the one of the first candidate read voltage level and the second candidate read voltage level as the target read voltage level according to the first candidate vector distance parameter and the second candidate vector distance parameter comprises:

determining a second vector distance parameter according to a second error evaluation parameter among the plurality of error evaluation parameters, wherein the second error evaluation parameter corresponds to the second read voltage level;

obtaining a first difference value between the first candidate vector distance parameter and the second vector distance parameter;

obtaining a second difference value between the second candidate vector distance parameter and the second vector distance parameter; and determining the one of the first candidate read voltage level and the second candidate read voltage level as the target read voltage level according to the first difference value and the second difference value.

24. The memory control circuit unit according to claim 23, wherein the operation of the memory management circuit determining the one of the first candidate read voltage level and the second candidate read voltage level as the target read voltage level according to the first difference value and the second difference value comprises:

obtaining a first difference value sum corresponding to the first candidate read voltage level according to the first difference value;

obtaining a second difference value sum corresponding to the second candidate read voltage level according to the second difference value;

determining the first candidate read voltage level as the target read voltage level in response to the first difference value sum being smaller than the second difference value sum; and determining the second candidate read voltage level as the target read voltage level in response to the second difference value sum being smaller than the first difference value sum.

* * * * *